United States Patent
Park et al.

(10) Patent No.: US 9,620,197 B1
(45) Date of Patent: Apr. 11, 2017

(54) CIRCUIT FOR DRIVING SENSE AMPLIFIER OF SEMICONDUCTOR MEMORY DEVICE AND OPERATING METHOD THEREOF

(71) Applicant: Samsung Electronics Co., Ltd., Suwon-si (KR)

(72) Inventors: Young-seok Park, Suwon-si (KR); Soo-bong Chang, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/224,684

(22) Filed: Aug. 1, 2016

(30) Foreign Application Priority Data

Oct. 7, 2015 (KR) .................... 10-2015-0141046

(51) Int. Cl.
*G11C 11/409* (2006.01)
*G11C 11/4091* (2006.01)
*G11C 11/408* (2006.01)
*G11C 11/4096* (2006.01)
*G11C 11/406* (2006.01)

(52) U.S. Cl.
CPC ...... *G11C 11/4091* (2013.01); *G11C 11/4087* (2013.01); *G11C 11/4096* (2013.01); *G11C 11/40618* (2013.01)

(58) Field of Classification Search
CPC ................................... G11C 11/409
USPC ....................................... 365/148
See application file for complete search history.

(56) References Cited

U.S. PATENT DOCUMENTS

| 4,961,166 | A  | * | 10/1990 | Sato et al. .......... G11C 11/4099 365/207 |
| 7,245,549 | B2 | * | 7/2007  | Komura et al. .... G11C 11/4076 365/203 |
| 7,440,345 | B2 |   | 10/2008 | Kim |
| 2003/0058722 | A1 |   | 3/2003  | Park |
| 2005/0052931 | A1 |   | 3/2005  | Hardee |
| 2005/0157534 | A1 | * | 7/2005  | Ferrant et al. ........ G11C 11/406 365/149 |
| 2006/0209606 | A1 |   | 9/2006  | Rajwani et al. |
| 2007/0030748 | A1 |   | 2/2007  | Byun et al. |
| 2007/0076501 | A1 |   | 4/2007  | Kang et al. |
| 2007/0201290 | A1 |   | 8/2007  | Kang |
| 2008/0049530 | A1 | * | 2/2008  | Hirota et al. .......... G11C 7/065 365/205 |
| 2012/0026777 | A1 | * | 2/2012  | Kitagawa et al. . G11C 13/0009 365/148 |
| 2014/0198596 | A1 |   | 7/2014  | Seo et al. |
| 2015/0003146 | A1 |   | 1/2015  | Chun et al. |

\* cited by examiner

*Primary Examiner* — Min Huang
(74) *Attorney, Agent, or Firm* — Muir Patent Law, PLLC

(57) ABSTRACT

A circuit for driving a sense amplifier of a semiconductor memory device is provided. The circuit includes a first driving circuit configured to supply a current from a power node to a first driving node of the sense amplifier based on a first driving control signal, a source control circuit configured to generate a control signal based on a second driving control signal and a voltage of the drain node, and a second driving circuit configured to draw current from a second driving node of the sense amplifier to a ground node based on the control signal.

20 Claims, 21 Drawing Sheets

CIRCUIT FOR DRIVING SENSE AMPLIFIER OF SEMICONDUCTOR MEMORY DEVICE AND OPERATING METHOD THEREOF

CROSS-REFERENCE TO RELATED APPLICATION

This application claims priority under 35 USC §119(a) to Korean Patent Application No. 10-2015-0141046, filed on Oct. 7, 2015, in the Korean Intellectual Property Office, the disclosure of which is incorporated herein in its entirety by reference.

BACKGROUND

The disclosure relates to a circuit for driving a sense amplifier, and more particularly, to a circuit for driving a sense amplifier of a semiconductor memory device and an operating method of the circuit.

A semiconductor memory device may include a plurality of memory cells, each of which has a state corresponding to stored data, and the plurality of memory cells may be arranged in rows and columns and thus form a memory cell array. Each of the plurality of memory cells may be connected to a bit line, and a memory cell corresponding to an address received by the semiconductor memory device may apply a signal corresponding to a state of the memory cell to a bit line. The signal applied to the bit line may be amplified by a sense amplifier, and data stored in the memory cell may be determined based on an amplified signal. When the sense amplifier does not operate normally, a time that is required to determine data may increase or incorrect data that does not correspond to the state of the memory cell may be determined.

SUMMARY

Some exemplary embodiments provide a sense amplifier driving circuit that supplies a current to a sense amplifier and draws current from the sense amplifier.

Some exemplary embodiments also provide an operating method of the sense amplifier driving circuit.

According to exemplary embodiments, there is provided a circuit for driving a sense amplifier of a semiconductor memory device, the circuit may include: a first driving circuit configured to supply current from a power node to a first driving node of the sense amplifier based on a first driving control signal; a source control circuit configured to generate a control signal based on a second driving control signal and a voltage of the drain node; and a second driving circuit configured to draw current from a second driving node of the sense amplifier and output the drawn current to a ground node based on the control signal, wherein the source control circuit generates the control signal so that an offset voltage of the second driving node and an offset voltage of the first driving node have different polarities when the second driving control signal is activated.

According to exemplary embodiments, there is provided a circuit for driving a sense amplifier of a semiconductor memory device, the circuit may include: a drain control circuit configured to generate a control signal based on a first driving control signal and a voltage of a second driving node of the sense amplifier; a first driving circuit configured to supply current from a power node to a first driving node of the sense amplifier based on the control signal; and a second driving circuit configured to draw current from the second driving node to a ground node based on a second driving control signal, wherein the drain control circuit generates the control signal so that an offset voltage of the first driving node and an offset voltage of the second driving node have different polarities when the first driving control signal is activated.

According to exemplary embodiments, a semiconductor memory device may include: a sense amplifier; and a sense amplifier driving circuit configured to drive the sense amplifier in response to first and second driving control signals, wherein the sense amplifier driving circuit comprises: a first driving circuit configured to supply current from a power node to a first driving node of the sense amplifier in response to the first driving control signal; a second driving circuit configured to draw current from a second driving node of the sense amplifier and output the drawn current to a ground node in response to the second driving control signal; and a control circuit configured to generate a control signal to control an operation of at least one of the first driving circuit in response to a voltage on the second driving node and an operation of the second driving circuit in response to a voltage on the first driving node.

According to exemplary embodiments, the first driving circuit may be configured to supply current from the power node to the first driving node of the sense amplifier based on the first driving control signal; the control circuit may be configured to generate the control signal based on a second driving control signal and a voltage of the first driving node; and the second driving circuit may be configured to draw current from the second driving node of the sense amplifier and output the drawn current to the ground node based on the control signal.

According to exemplary embodiments, the control circuit may be configured to generate the control signal in a manner such that an offset voltage of the first driving node and an offset voltage of the second driving node have opposite polarities when the second driving control signal is activated, wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1's and '0's.

According to exemplary embodiments, wherein a ratio of the offset voltage of the second driving node to the offset voltage of the first driving node remains substantially constant.

According to exemplary embodiments, wherein the second driving circuit comprises an N-type metal oxide semiconductor (MOS) transistor having a source connected to the ground node, a gate to which the control signal is applied, and a drain connected to the source node.

According to exemplary embodiments, wherein the control circuit comprises an N-type MOS transistor having a drain to which the voltage of the first driving node is applied, a gate to which the second driving control signal is applied, and a source outputting the control signal.

According to exemplary embodiments, wherein a ratio of the offset voltage of the second driving node to the offset voltage of the first driving node in response to the control signal remains substantially constant based on a size of the N-type MOS transistor of the second driving circuit.

According to exemplary embodiments, wherein the control circuit comprises: a voltage amplifier configured to amplify the voltage of the first driving node; and an N-type MOS transistor having a drain to which an output of the voltage amplifier is applied, a gate to which the second driving control signal is applied, and a source outputting the control signal.

According to exemplary embodiments, wherein a ratio of the offset voltage of the second driving node to the offset voltage of the first driving node in response to the control signal remains substantially constant based on a gain of the voltage amplifier.

According to exemplary embodiments, wherein the first driving circuit is connected to first driving nodes of a plurality of sense amplifiers, the second driving circuit is connected to second driving nodes of the plurality of sense amplifiers, and the number of the plurality of sense amplifiers corresponds to the number of bit line pairs arranged in a bank of the semiconductor memory device.

According to exemplary embodiments, a circuit for driving a sense amplifier of a semiconductor memory device is disclosed. The circuit may include: a first control circuit configured to generate a control signal based on a first driving control signal and a voltage of a first driving node of the sense amplifier; a first driving circuit configured to supply current from a power node to a second driving node of the sense amplifier based on the control signal; and a second driving circuit configured to draw current from the first driving node to a ground node based on a second driving control signal, wherein the first control circuit generates the control signal so that a deviation of the voltage of the first driving node from a first voltage and a deviation of a voltage of the second driving node from the first voltage is substantially the same upon driving the sense amplifier.

According to exemplary embodiments, wherein the control circuit is configured to generate the control signal in a manner such that an offset voltage of the first driving node and an offset voltage of the second driving node have opposite polarities when the first driving control signal is activated, wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1's and '0's.

According to exemplary embodiments, wherein a ratio of the offset voltage of the first driving node to the offset voltage of the second driving node remains substantially constant.

According to exemplary embodiments, wherein the first driving circuit comprises a P-type metal oxide semiconductor (MOS) transistor having a source connected to the power node, a gate to which the control signal is applied, and a drain connected to the first driving node.

According to exemplary embodiments, wherein the control circuit comprises a P-type MOS transistor having a drain to which the voltage of the second driving node is applied, a gate to which the first driving control signal is applied, and a source outputting the control signal.

According to exemplary embodiments, wherein a ratio of the offset voltage of the first driving node to the offset voltage of the second driving node in response to the control signal remains substantially constant based on a size of the P-type MOS transistor of the first driving circuit.

According to exemplary embodiments, wherein the control circuit may include: a voltage amplifier configured to amplify the voltage of the second driving node; and a P-type MOS transistor having a drain to which an output of the voltage amplifier is applied, a gate to which the first driving control signal is applied, and a source outputting the control signal.

According to exemplary embodiments, wherein a ratio of the offset voltage of the first driving node to the offset voltage of the second driving node in response to the control signal remains substantially constant based on a gain of the voltage amplifier.

According to exemplary embodiments, a semiconductor memory device may include: a sense amplifier; and a sense amplifier driving circuit configured to drive the sense amplifier based on a driving signal, wherein the sense amplifier driving circuit comprises: a first driving circuit configured to supply current from a power node to a first driving node of the sense amplifier based on a first driving control signal; a control circuit configured to generate a control signal based on a second driving control signal and a voltage of the first driving node; and a second driving circuit configured to draw current from a second driving node of the sense amplifier and output the drawn current to a ground node based on the control signal.

According to exemplary embodiments, wherein the control circuit may be configured to generate the control signal in a manner such that an offset voltage of the second driving node and an offset voltage of the first driving node have opposite polarities when the second driving control signal is activated.

According to exemplary embodiments, a semiconductor memory device may include: a sense amplifier; and a sense amplifier driving circuit configured to drive the sense amplifier based on a driving signal, wherein the sense amplifier driving circuit comprises: a control circuit configured to generate a control signal based on a first driving control signal and a voltage of a second driving node of the sense amplifier; a first driving circuit configured to supply current from a power node to a first driving node of the sense amplifier based on the control signal; and a second driving circuit configured to draw current from the second driving node to a ground node based on a second driving control signal.

According to exemplary embodiments, wherein the control circuit may be configured to generate the control signal in a manner such that an offset voltage of the first driving node and an offset voltage of the second driving node have opposite polarities when the first driving control signal is activated, wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1' s and '0' s.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
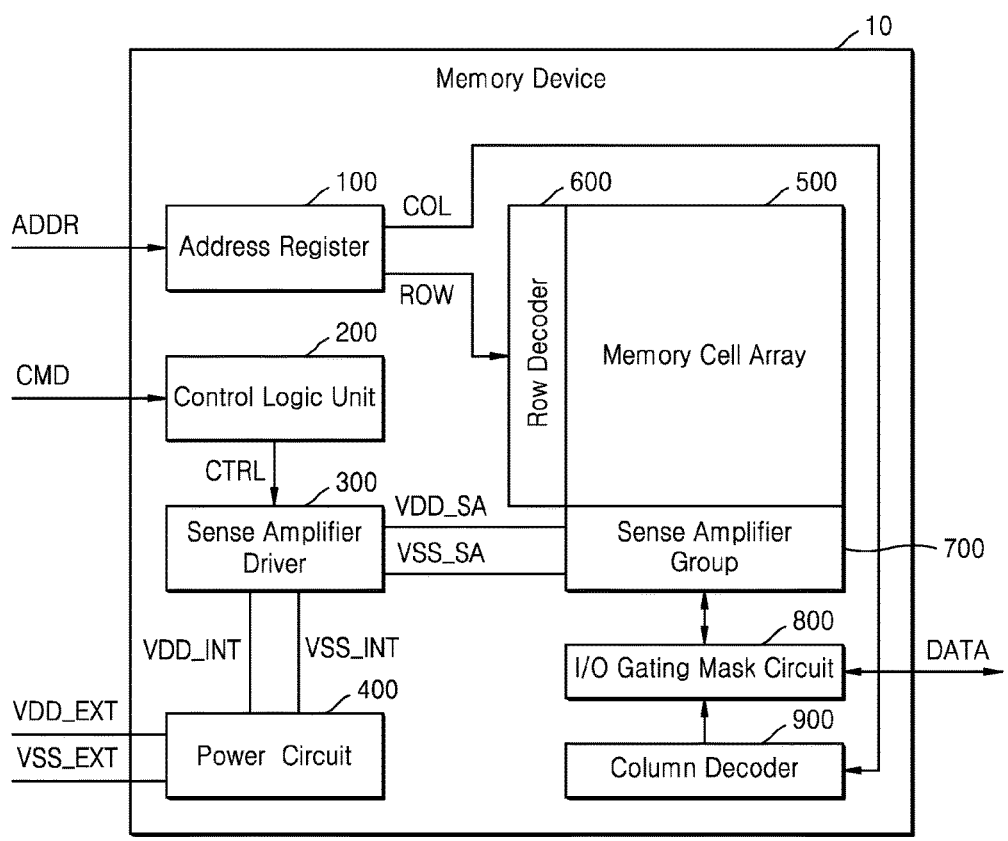
FIG. 1 is a block diagram of a memory device according to an exemplary embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

As used herein, expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

FIG. 1 is a block diagram of a memory device 10 according to an exemplary embodiment. The memory device 10 may be a semiconductor memory device. In some embodiments, the memory device 10 may be a single memory chip or a memory module including a plurality of memory devices. In some exemplary embodiments, the memory device 10 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

As shown in FIG. 1, the memory device 10 may receive an address ADDR and a command CMD from the outside of the memory device 10, receive or transmit data DATA from or to the outside, and receive power supply voltages VDD_EXT and VSS_EXT. Referring to FIG. 1, according to an exemplary embodiment, the memory device 10 may include an address register 100, a control logic unit (e.g., a logic circuitry) 200, a sense amplifier driving circuit (or sense amplifier driver) 300, a power circuit 400, a memory cell array 500, a row decoder 600, a sense amplifier group 700, an input/output gating mask circuit 800, and a column decoder 900.

In some embodiments, the address register 100 may receive the address ADDR, and may output a row address ROW and a column address COL. The row decoder 600 may receive the row address ROW from the address register 100, and may activate a word line, connected to a plurality of memory cells, in response to the row address ROW. The column decoder 900 may receive the column address COL from the address register 100, and may output a signal to control the input/output gating mask circuit 800 in response to the column address COL so that the input/output gating mask circuit 800 selects some of a plurality of bit lines. The input/output gating mask circuit 800 may select some of the plurality of bit lines in response to the output signal of the column decoder 900, and may output signals of the selected bit lines as data DATA or apply signals corresponding to input data DATA to the selected bit lines.

The control logic unit 200 may receive a command CMD, and may output a plurality of control signals for controlling elements of the memory device 10 in response to the received command CMD. For example, as shown in FIG. 1, the control logic unit 200 may decode the received command CMD, and may output a sense amplifier control signal CTRL for controlling the sense amplifier driving circuit 300 based on decoded information.

The sense amplifier driving circuit 300 may receive the sense amplifier control signal CTRL from the control logic unit 200, and may receive internal voltages VDD_INT and VSS_INT from the power circuit 400. The sense amplifier driving circuit 300 may provide sense amplifier driving voltages VDD_SA and VSS_SA to the sense amplifier group 700 based on the sense amplifier control signal CTRL and the internal voltages VDD_INT and VSS_INT. As described below with reference to FIG. 2, the sense amplifier driving voltages VDD_SA and VSS_SA output from the sense amplifier driving circuit 300 may be respectively provided to a SAP driving node and a SAN driving node of the sense amplifier group 700. The SAP driving node may be a sense amplifier PMOS driving node to drive PMOS transistors of the sense amplifiers of the sense amplifier group 700 with a positive power voltage (e.g., such as a power supply voltage equal to VDD or substantially equal to VDD, such as VDD minus a threshold voltage of a transistor). The SAN driving node of sense amplifier group 700 may be a sense amplifier NMOS driving node to drive NMOS transistors of the sense amplifiers of the sense amplifier group 700 with a reference voltage (e.g., such as a reference voltage of a power supply, such as VSS or substantially equal to VSS, such as VSS plus a threshold voltage of a transistor).

In this exemplary embodiment, the power circuit 400 may transmit power supplied from the outside of the memory device 10 to the elements of the memory device 10. For example, as shown in FIG. 1, the power circuit 400 may receive voltages VDD_EXT and VSS_EXT from the outside of the memory device 100, and may output the internal voltages VDD_INT and VSS_INT. The voltage VDD_EXT corresponding to relatively high potential may be referred to as a power supply voltage of the memory device 10, and the voltage VSS_EXT corresponding to relatively low potential may be referred to as a ground voltage. According to exemplary embodiments, the power circuit 400 may perform power gating with respect to power that is supplied to the memory device 10 and provide different voltage to the elements of the memory device 10, and may include devices (for example, a bypass capacitor and the like) for stabilizing power that is supplied to the elements of the memory device 10.

The memory cell array 500 may include a plurality of memory cells. In an exemplary embodiment, the plurality of memory cells may be volatile memory cells, and as a non-limiting example, the memory device 10 may be dynamic random access memory (DRAM), static random access memory (SRAM), mobile DRAM, double data rate synchronous DRAM (DDR SDRAM), low power DDR (LPDDR) SDRAM, graphic DDR (GDDR) SDRAM, or Rambus DRAM (RDRAM). In another exemplary embodiment, the plurality of memory cells may be non-volatile memory cells, and as a non-limiting example, the memory device 10 may be electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), or ferroelectric random access memory (FRAM). Hereinafter, although a case in which the memory device 10 is a DRAM is described, the inventive concept is not limited thereto.

In the memory cell array 500, according to an exemplary embodiment, a plurality of memory cells may be arranged in row and column directions. For example, the plurality of memory cells of the memory cell array 500 may be connected to a plurality of word lines that are arranged parallel to each other and are activated by the row decoder 600, and may be connected to a plurality of bit lines that extend to a direction perpendicular to the word lines and are parallel to each other. According to this exemplary embodiment, a memory cell connected to an activated word line may output a signal, which corresponds to data stored in the memory cell, through a bit line connected to the memory cell.

In some embodiments, the sense amplifier group 700 may include a plurality of sense amplifiers, and the plurality of sense amplifiers may be respectively connected to the plurality of bit lines. Each of the plurality of sense amplifiers may output a signal corresponding to data stored in a memory cell by amplifying a signal received through a bit line. In order to increase a space efficiency of the memory device 100, a SAP driving node and a SAN driving node may be shared by a plurality of sense amplifiers of the sense amplifier group 700. For example, the sense amplifier driving voltages VDD_SA and VSS_SA that are provided from the sense amplifier driving circuit 300 may be respectively applied to the SAP driving node and the SAN driving node which are shared by the plurality of sense amplifiers of the sense amplifier group 700.

In some embodiments, when the majority of a plurality of memory cells connected to an activated word line store the same data (e.g., all ones or zeros), the majority of a plurality of bit lines connected to the plurality of memory cells may transmit the same signals to the sense amplifier group 700. Conventionally, as described below with reference to FIGS. 4A and 4B, voltages of the SAP and SAN driving nodes that are shared by the plurality of sense amplifiers of the sense amplifier group 700 may be offset by voltages having the same polarity (e.g., with respect with a target driving operation, both SAP and SAN driving nodes may be offset with positive voltages or both the SAP and SAN driving nodes may be offset with negative voltages). The offset voltages of the same polarity on the SAP and SAN driving nodes may cause malfunctions of the sense amplifiers of the sense amplifier group 700 or may increase a time that is taken in order for the sense amplifiers to sense signals that are received through bit lines.

The sense amplifier driving circuit 300 according to the current exemplary embodiment may cause offset voltages of opposite polarities with respect to the sense amplifier driving voltages VDD_SA and VSS_SA when the majority of sense amplifiers of the sense amplifier group 700 receives the same signal (e.g., all ones or all zeros) through the majority of the bit lines. For example, in one embodiment, the sense amplifier driving circuit 300 may drive the SAP and SAN driving nodes so that a negative offset voltage is provided on the SAN driving node when the a positive offset voltage is provided on the SAP driving node. The sense amplifier driving circuit 300 may also may drive the SAP and SAN driving nodes so that a positive offset voltage is provided on the SAN driving node when a negative offset voltage of is provided on the SAP driving node. As a result, the sense amplifier driving circuit 300 may prevent malfunctions of the sense amplifiers of the sense amplifier group 700, and may prevent an increase of a time that is taken in order for the sense amplifiers to sense signals that are received through bit lines.

Figure 2:
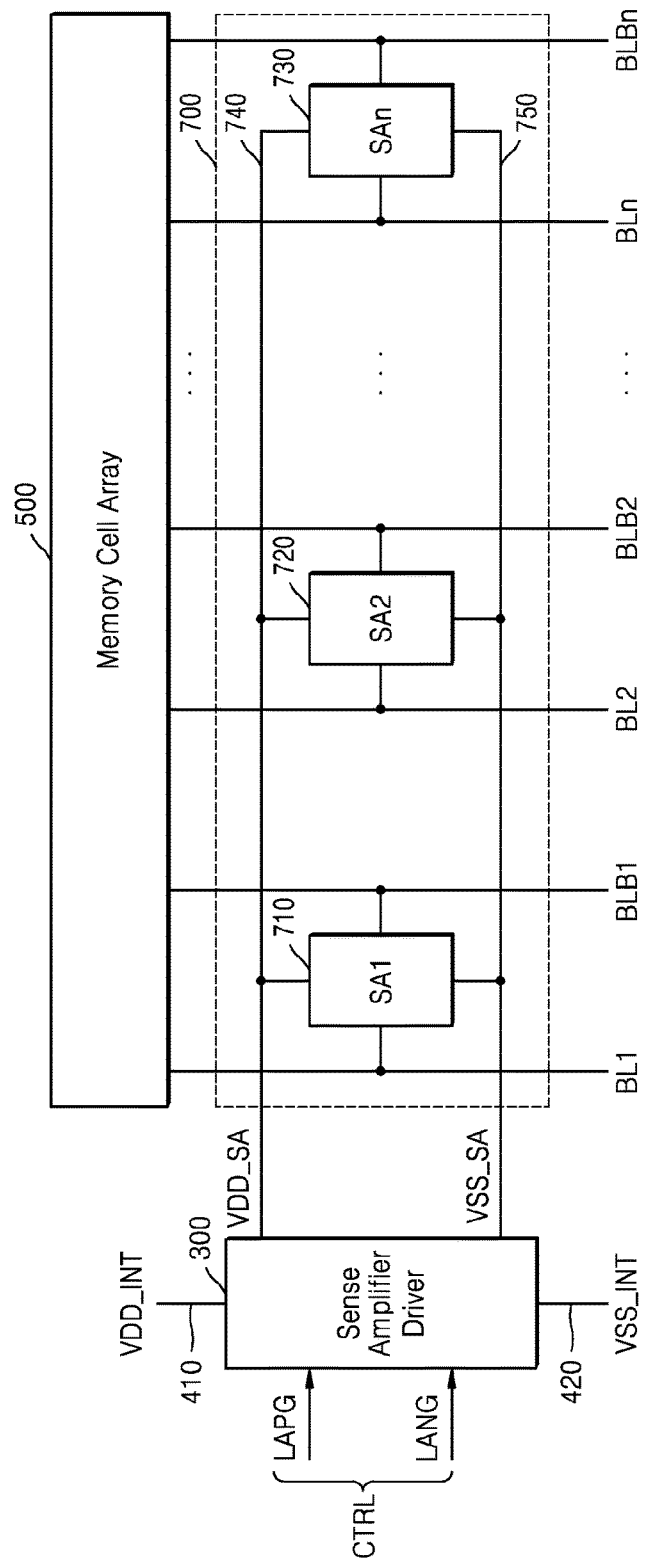
FIG. 2 is a block diagram illustrating a sense amplifier group and a sense amplifier driving circuit of FIG. 1.

FIG. 2 is a block diagram illustrating, according to an exemplary embodiment, the sense amplifier group 700 and the sense amplifier driving circuit 300 of FIG. 1. As described above with reference to FIG. 1, the sense amplifier driving circuit 300 may provide the sense amplifier driving voltages VDD_SA and VSS_SA to the sense amplifier group 700, and the sense amplifier group 700 may be connected to the memory cell array 500 through the plurality of bit lines.

Referring to FIG. 2, the sense amplifier group 700 may include n sense amplifiers including first, second, and n-th sense amplifiers 710, 720, and 730, respectively (where n is an integer that is equal to or greater than 3). Each of the n sense amplifiers may be connected to a SAP driving node 740 and a SAN driving node 750, and may be connected to corresponding bit lines. For example, the first sense amplifier 710 may be connected to the SAP driving node 740 and the SAN driving node 750, and may be connected to a first bit line pair BL1 and BLB1, the second sense amplifier 720 may be connected to the SAP driving node 740 and the SAN driving node 750, and may be connected to a second bit line pair BL2 and BLB2, and the n-th sense amplifier 730 may be connected to the SAP driving node 740 and the SAN driving node 750, and may be connected to an n-th bit line pair BLn and BLBn. The n sense amplifiers may receive a current through the SAP driving node 740, and may draw current to the SAN driving node 750. When n memory cells in the memory cell array 500 are connected to one word line, n sense amplifiers may be provided and simultaneously sense signals that are output from the n memory cells.

As described above with reference to FIG. 1, the sense amplifier driving circuit 300 may receive the internal voltages VDD_INT and VSS_INT from the power circuit 400. Hereinafter, a node to which the internal voltage VDD_EXT corresponding to relatively high potential is applied is referred to as a power node 410, and a node to which the internal voltage VSS_EXT corresponding to relatively low potential is applied is referred to as a ground node 420.

In some embodiments, the sense amplifier driving circuit 300 may receive the sense amplifier control signal CTRL. As shown in FIG. 2, the sense amplifier control signal CTRL may include a SAP driving control signal LAPG and a SAN driving control signal LANG. The sense amplifier driving circuit 300 may supply a current from the power node 410 to the SAP driving node 740 based on the SAP driving control signal LAPG, and may discharge or draw current from the SAN driving node 750 to the ground node 420 based on the SAN driving control signal LANG. The sense amplifier driving circuit 300 may supply current from the power node 410 to the SAP driving node 740 and discharge the SAN driving node 750, shared by the n sense amplifiers, so that the voltage VDD_SA of the SAP driving node 740 and the voltage VSS_SA of the SAN driving node 750 may have an offset voltage of the different polarities when a majority of the n sense amplifiers sense the same signals that are received from memory cells (e.g., as a result of this majority of n sense amplifiers storing the same data bits represented by the same voltage levels).

Figure 3:
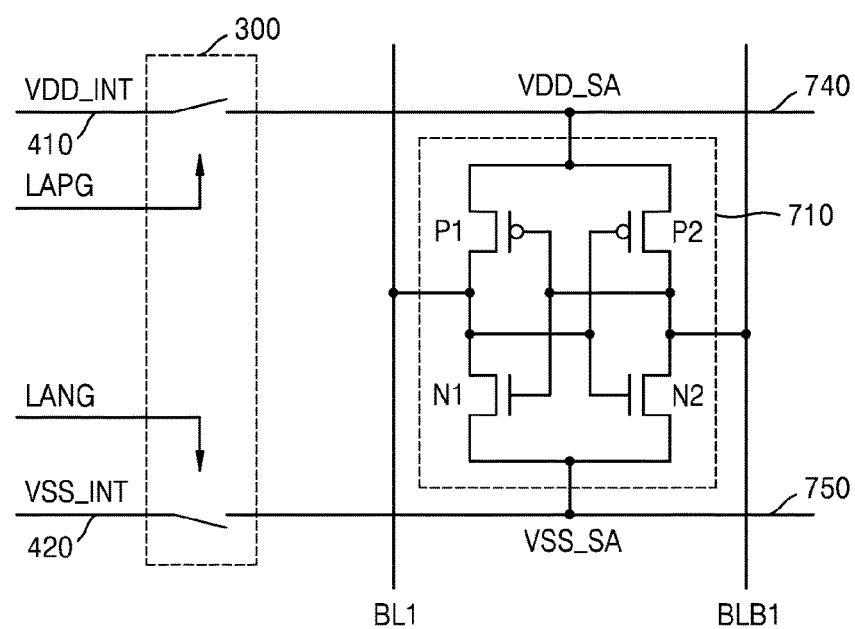
FIG. 3 is a diagram illustrating exemplary structures of a first sense amplifier and a sense amplifier driving circuit of FIG. 2.

FIG. 3 is a diagram illustrating exemplary structures of the first sense amplifier 710 and the sense amplifier driving circuit 300 of FIG. 2. Although only the first sense amplifier 710 is shown in FIG. 3, the n sense amplifiers of FIG. 2 may have the same structure as the first sense amplifier 710 shown in FIG. 3 and may be connected to the SAP driving node 740 and the SAN driving node 750. In addition, the structure of the first sense amplifier 710 shown in FIG. 3 is only an example, and the first sense amplifier 710 may have a structure that is different from that shown in FIG. 3. Sense amplifier driver 300 described herein (e.g., with respect to FIGS. 1-3) may be embodied by the novel sense amplifier driver circuits described herein, such as sense amplifier driving circuit 310 (e.g., of FIG. 5), including the exemplary implementations of sense amplifier driving circuits 310*a*, 310*b* and 310*c* (e.g., of FIGS. 6A, 6B and 7), and/or such as sense amplifier driving circuit 320 (e.g., of FIG. 8), including the exemplary implementations of sense amplifier driving circuits 320*a*, 320*b* and 320*c* (e.g., of FIGS. 9A, 9B and 10). It should also be emphasized that sense amplifier driver circuit 300 may be embodied by more than one of the sense novel sense amplifier driving circuits described herein, such as by use of both sense amplifier driving circuits 310 and 320, such as by connecting one of (or more than one of) sense amplifier driver circuits 310*a*, 310*b* and 310*c* and one of (or more than one of) sense amplifier driving circuits 320*a*, 320*b* and 320*c* in common to internal voltages VDD_INT and VSS_INT, driving control signals LAPG and LANG, and driving nodes 740 and 750.

Referring to FIG. 3, in this exemplary embodiment, the first sense amplifier 710 may include two N-type metal oxide semiconductor (NMOS) transistors N1 and N2 and two P-type metal oxide semiconductor (PMOS) transistors P1 and P2. Memory cells connected to the bit lines BL1 and BLB1 may apply signals to the bit lines BL1 and BLB1 in response to a signal of an activated word line. For example, when data stored in a memory cell connected to the bit line BL1 is '1', the memory cell may transmit a positive charge to the bit line BL1 pre-charged with a reference voltage (for example, a voltage V_HALF of FIG. 4A), and thus, a voltage of the bit line BL1 may rise to a voltage that is higher than the reference voltage. Alternatively, when data stored in a memory cell connected to the bit line BL1 is '0', the memory cell may transmit a negative charge to the bit line BL1 pre-charged with the reference voltage (for example, the voltage V_HALF of FIG. 4A), and thus, a voltage of the bit line BL1 may fall to a voltage that is lower than the reference voltage. The first sense amplifier 710 may sense a voltage difference between the bit line BL1 having a voltage rising or falling according to data stored in a memory cell and a bit line BLB1 pre-charged with the reference voltage and amplify the sensed voltage difference.

In this exemplary embodiment, the sense amplifier driving circuit 300 may electrically connect the power node 410 to the SAP driving node 740 in response to the SAP driving control signal LAPG. For example, when the SAP driving control signal LAPG is activated, the sense amplifier driving circuit 300 may electrically connect the power node 410 to the SAP driving node 740. In addition, the sense amplifier driving circuit 300 may electrically connect the ground node 420 to the SAN driving node 750 in response to the SAN driving control signal LANG. For example, when the SAN driving control signal LANG is activated, the sense amplifier driving circuit 300 may electrically connect the ground node 420 to the SAN driving node 750.

Referring to FIG. 3, in the first sense amplifier 710, the sizes of the NMOS transistors N1 and N2 and the sizes of the PMOS transistors P1 and P2 may be adjusted to satisfy a predetermined P/N ratio. In the first sense amplifier 710 having an inverter latch structure as shown in FIG. 3, maintaining a P/N ratio without being disturbed from a process variation may be helpful for the operation of the first sense amplifier 710. However, when the voltage VDD_SA of the SAP driving node 740 and the voltage VSS_SA of the SAN driving node 750 have an offset of the same polarity, the ratio (or P/N ratio) of a current driving capability of a PMOS transistor operating between the SAP driving node 740 and the SAN driving node 750 to a current driving capability of an NMOS transistor operating between the SAP driving node 740 and the SAN driving node 750 may be changed with respect to the same input signal, that is, the same signal that is received through the bit lines BL1 and BLB1, and thus, a malfunction of the first sense amplifier 710 may be caused. The P/N ratio may also be considered to be a ratio of the driving capability of the PMOS sense amplifier of the sense amplifier 710 (comprising transistors P1 and P2 and their interconnections) to the driving capability of the NMOS sense amplifier of the sense amplifier 710 (comprising transistors N1 and N2 and their interconnections).

Figure 4A:
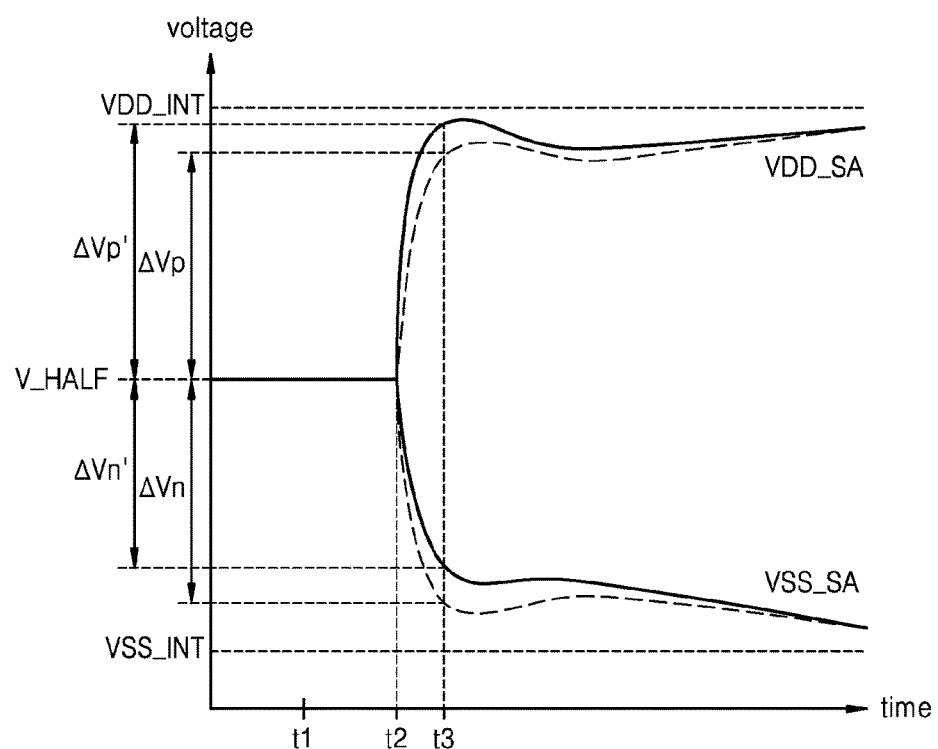
FIGS. 4A and 4B are graphs illustrating voltage changes of drain and source nodes when sense amplifiers operate, according to an exemplary embodiment.
Figure 4B:
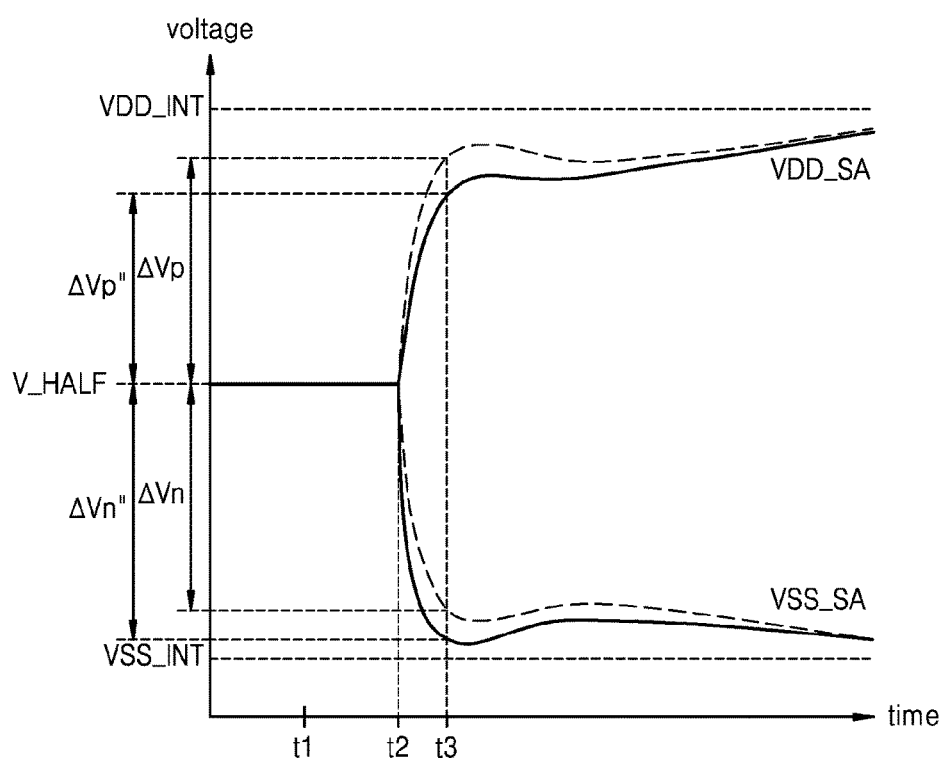

FIGS. 4A and 4B are graphs illustrating voltage changes of the SAP driving node 740 and SAN driving node 750 connected to the sense amplifiers 710, 720, and 730 shown in FIG. 2. In detail, FIG. 4A is a graph illustrating voltage changes of the SAP driving node 740 and source node 750 when data stored in the majority of memory cells of the memory cell array 500 connected to an activated word line is '1', and FIG. 4B is a graph illustrating voltage changes of the drain and source nodes 740 and 750 when data stored in the majority of memory cells connected to an activated word line is '0'. In FIGS. 4A and 4B, a curve indicated by a dashed line illustrates changes of the drain and source nodes 740 and 750, respectively, when data stored in the majority of memory cells connected to an activated word line is not '1' or '0', e.g., when the memory cells relatively evenly stores '1' or '0'. Hereinafter, FIGS. 4A and 4B will be described with reference to FIGS. 1 and 3.

Referring to FIG. 4A, the voltage VDD_SA of the SAP driving node 740 and the voltage VSS_SA of the SAN driving node 750 may be maintained to the reference voltage V_HALF. When a word line is activated at a time t1, memory cells connected to the word line may transmit charges corresponding to data stored therein to bit lines. At time t2, the SAP driving control signal LAPG and the SAN driving control signal LANG may be activated at the same time or with a time delay. Accordingly, the voltage VDD_SA of the SAP driving node 740 may increase, and the voltage VSS_SA of the SAN driving node 750 may decrease. The voltage VDD_SA and the voltage VSS_SA may have an offset of the same polarity when the majority of signals that are received through the bit lines are the same. In a transient response period for an activated SAP driving control signal LAPG and an activated SAN driving control signal LANG, the voltage VDD_SA and the voltage VSS_SA may have an offset of the same polarity.

As shown in FIG. 4A, when data stored in the majority of memory cells connected to an activated word line is '1', each of the voltage VDD_SA of the SAP driving node 740 and the voltage VSS_SA of the SAN driving node 750 may have a positive offset based on the curve indicated by a dashed line. The offset of the SAP driving node 740 and the offset voltage of the second driving node SAN may be determined as the respective differences of VDD_SA and VSS_SA (e.g., as shown in FIG. 4A or FIG. 4B) with voltages VDD_SA and VSS_SA that are driven by sense amplifier drive circuit 300 when operating under more typical operation (e.g., as designed), such as when operating sense amplifier drive circuit 300 drives a plurality of sense amplifiers to sense data of memory cells of a word line storing a substantially equal number of data bits of '1's and '0's. Referring to FIG. 3, when the bit line BL1 has a voltage that is higher than the reference voltage V_HALF, the voltage VSS_SA of the SAN driving node 750 decreases from the reference voltage V_HALF, and thus, the NMOS transistor N2 having a source connected to the SAN driving node 750 and a gate connected to the bit line BL1 may be turned on at a relatively high source voltage. Accordingly, when the majority of the sense amplifiers sense a signal corresponding to '1', the voltage VSS_SA of the SAN driving node 750 may decrease by the relatively small amount of voltage. In addition, when the bit line BL1 has a voltage that is higher than the reference voltage V_HALF, the PMOS transistor P2 having a source connected to the SAP driving node 740 and a gate connected to the bit line BL1 may be turned on at a relatively high drain voltage. Accordingly, when the majority of the sense amplifiers sense a signal corresponding to '1', the voltage VDD_SA of the SAP driving node 740 may increase by the relatively large amount of voltage.

Similarly, when data stored in the majority of memory cells connected to an activated word line is '1', the ratio of a variation in the voltage VDD_SA of the SAP driving node 740 from the reference voltage V_HALF to a variation in the voltage VSS_SA of the SAN driving node 750 from the reference voltage V_HALF may be changed. Referring to the curve indicated by a dashed line in FIG. 4A, when memory cells connected to an activated word lines relatively evenly store '1' or '0', the ratio of a variation $\Delta Vp$ in the voltage VDD_SA of the SAP driving node 740 to a variation $\Delta Vn$ in the voltage VSS_SA of the SAN driving node 750 at t3 may be ΔVp/ΔVn. Referring to a curve indicated by a solid line in FIG. 4A, when the majority of memory cells connected to an activated word lines store '1', the ratio of a variation ΔVp' in the voltage VDD_SA of the SAP driving node 740 to a variation ΔVn' in the voltage VSS_SA of the SAN driving node 750 at t3 may be ΔVp'/ΔVn'. As shown in FIG. 4A, ΔVp'/ΔVn' may be larger than ΔVp/ΔVn. As shown in FIG. 4A, when the voltage VDD_SA of the SAP driving node 740 and the voltage VSS_SA of the SAN driving node 750 have a positive offset, a current driving capability of a PMOS transistor may increase, whereas a current driving capability of an NMOS transistor may decrease, and thus, a P/N ratio may increase from a reference P/N ratio.

Referring to FIG. 4B, when data stored in the majority of memory cells connected to an activated word lines is '0', the voltage VDD_SA of the SAP driving node 740 and the voltage VSS_SA of the SAN driving node 750 may have a negative offset based on the curve indicated by a dashed line. Referring to FIG. 3, when the bit line BL1 has a voltage that is lower than the reference voltage V_HALF, the voltage VSS_SA of the SAN driving node 750 decreases from the reference voltage V_HALF, and thus, the NMOS transistor N2 having a source connected to the SAN driving node 750 and a gate connected to the bit line BL1 may be turned on at a relatively low voltage. Accordingly, when the majority of the sense amplifiers sense a signal corresponding to '0', the voltage VSS_SA of the SAN driving node 750 may decrease by the relatively small amount of voltage. In addition, when the bit line BL1 has a voltage that is lower than the reference voltage V_HALF, the PMOS transistor P2 having a source connected to the SAP driving node 740 and a gate connected to the bit line BL1 may be turned on at a relatively low drain voltage. Accordingly, when the majority of the sense amplifiers sense a signal corresponding to '0', the voltage VDD_SA of the SAP driving node 740 may increase by the relatively large amount of voltage.

Similarly, in some embodiments, when data stored in the majority of memory cells connected to an activated word line is '0', the ratio of a variation in the voltage VDD_SA of the SAP driving node 740 from the reference voltage V_HALF to a variation in the voltage VSS_SA of the SAN driving node 750 from the reference voltage V_HALF may be changed. Referring to a curve indicated by a solid line in FIG. 4B, when the majority of memory cells connected to an activated word lines store '0', the ratio of a variation ΔVp" in the voltage VDD_SA of the SAP driving node 740 to a variation ΔVn" in the voltage VSS_SA of the SAN driving node 750 at t3 may be ΔVp"/ΔVn". As shown in FIG. 4B, ΔVp"/ΔVn" may be smaller than ΔVp/ΔVn. As shown in FIG. 4B, when the voltage VDD_SA of the SAP driving node 740 and the voltage VSS_SA of the SAN driving node 750 have an offset of a negative polarity, a current driving capability of a PMOS transistor may decrease, whereas a current driving capability of an NMOS transistor may increase, and thus, a P/N ratio may decrease from a reference P/N ratio.

As described below with reference to the following drawings, when the majority of memory cells connected to an activated word line stores '1' or '0', a variation in the voltage VDD_SA of the SAP driving node 740 from V_HALF and a variation in the voltage VSS_SA of the SAN driving node 750 may be maintained to be substantially constant according to an exemplary embodiment, unlike the graphs shown in FIGS. 4A and 4B. That is, a P/N ratio of a sense amplifier may be maintained to be substantially constant. Accordingly, the sense amplifier may operate independently of data stored in the memory cells.

Figure 5:
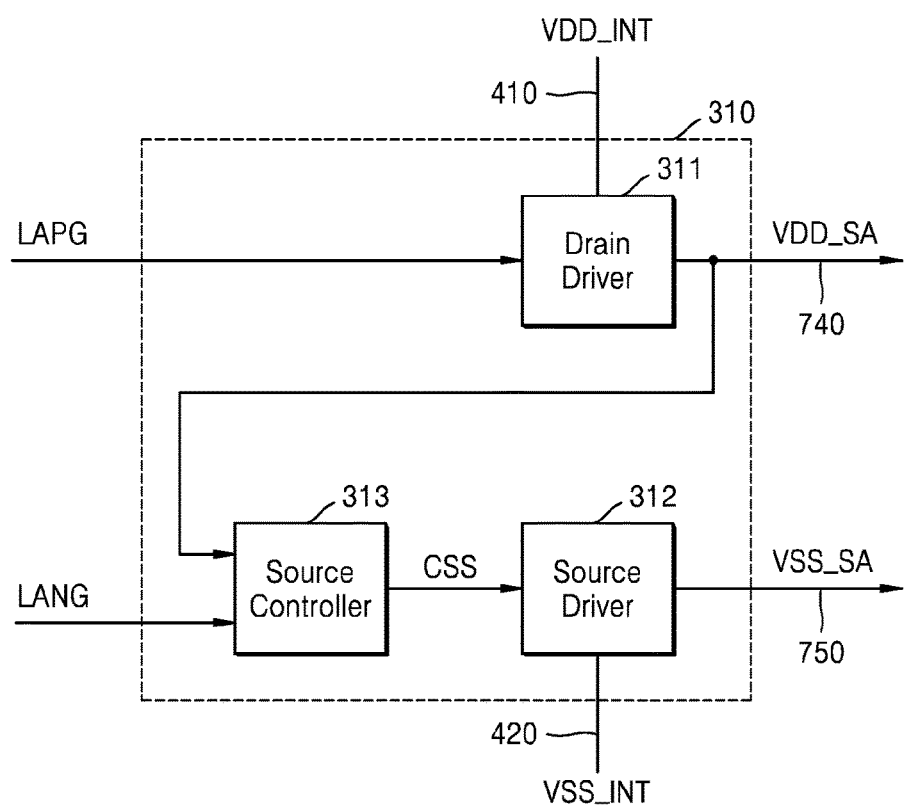
FIG. 5 is a block diagram of a sense amplifier driving circuit according to an exemplary embodiment.

FIG. 5 is a block diagram of a sense amplifier driving circuit 310 according to an exemplary embodiment. As shown in FIG. 5, the sense amplifier driving circuit 310 may include a drain driver 311, a source driver 312, and a source controller 313.

The drain driver 311 may supply a current from a power node 410 to a SAP driving node 740 based on a SAP driving control signal LAPG. For example, the drain driver 311 may include a switch that electrically connects the power node 410 to the SAP driving node 740 when the SAP driving control signal LAPG is activated.

The source controller 313 may generate a source control signal CSS based on a SAN driving control signal LANG and a voltage VDD_SA of the SAP driving node 410. For example, as described below with reference to FIGS. 6A and 6B, the source controller 313 may generate the source control signal CSS, which has a voltage that is proportional to the voltage VDD_SA of the SAP driving node 410, when the SAN driving control signal LANG is activated.

The source driver 312 may draw current from a SAN driving node 750 to a ground node 420 based on the source control signal CSS. For example, the source driver 312 may include a switch that electrically connects the SAN driving node to the ground node 420, and the amount of current that is drawn from the SAN driving node 750 to the ground node 420 through the switch may adjusted according to a voltage of the source control signal CSS. Due to a voltage VDD_SA of the SAP driving node 740 which has a positive offset, the source control signal CSS may have a relatively high voltage, and the source driver 312 may increase a current that is drawn from the SAN driving node 750 to the ground node 420, in response to the source control signal CSS. Accordingly, a voltage VSS_SA of the SAN driving node 750 may have a negative offset. Due to the voltage VDD_SA of the SAP driving node 740 which has a negative offset, the source control signal CSS may have a relatively low voltage, and the source driver 312 may decrease a current that is drawn from the SAN driving node 750 to the ground node 420, in response to the source control signal CSS. Accordingly, the voltage VSS_SA of the SAN driving node 750 may have a positive offset. That is, the amount of the offset of the voltage VSS_SA of the SAN driving node 750 may be proportional to the amount of the offset of the voltage VDD_SA of the SAP driving node 740. For example, if the amount of the offset of the voltage VSS_SA of the SAN driving node 750 is increased, the amount of the offset of the voltage VDD_SA of the SAP driving node 740 is also increased (in magnitude, but with an opposite polarity). Alternatively, if the amount of the offset of the voltage VSS_SA of the SAN driving node 750 is decreased, the amount of the offset of the voltage VDD_SA of the SAP driving node 740 is also decreased (in magnitude, but with an opposite polarity).

Regarding the sense amplifier driving circuit 310, the sign (e.g., polarity) of the offset of the voltage VDD_SA of the SAP driving node 740 may be different from that of the offset of the voltage VSS_SA of the SAN driving node 750, and the amount of the offset of the voltage VDD_SA and the amount of the offset of the voltage VSS_SA may be adjusted so that a P/N ratio of a sense amplifier is maintained to be substantially constant.

Figure 6A:
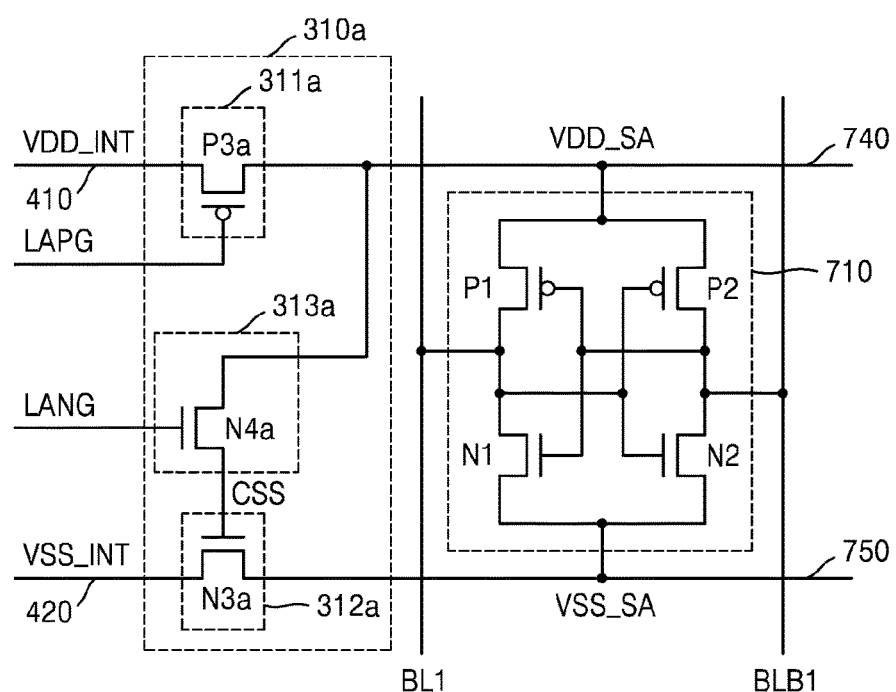
FIGS. 6A and 6B are circuit diagrams illustrating examples of the sense amplifier driving circuit of FIG. 5.
Figure 6B:
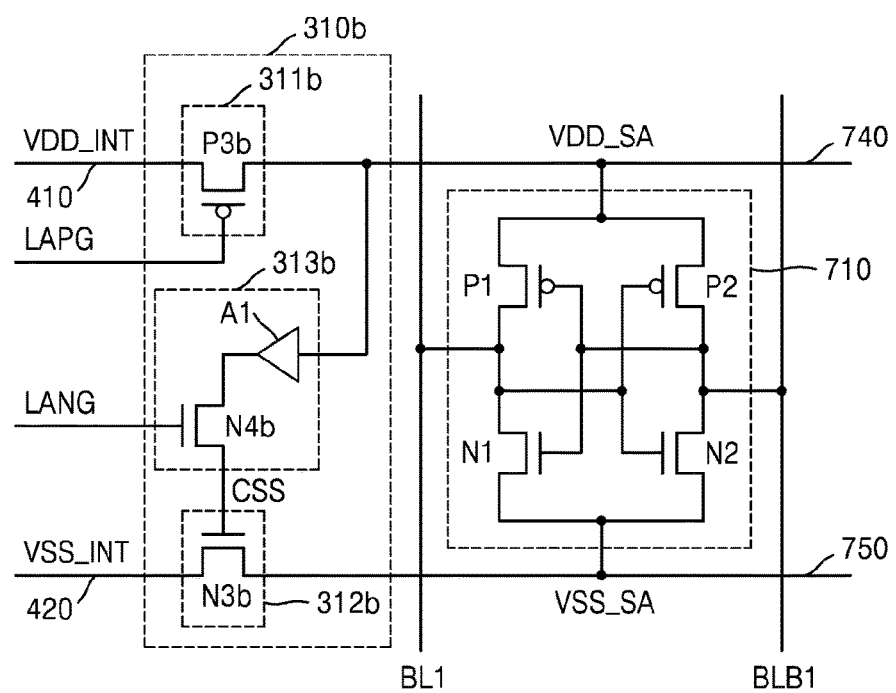

FIGS. 6A and 6B are circuit diagrams illustrating examples of the sense amplifier driving circuit 310 of FIG. 5 according to some exemplary embodiments. It is assumed that a first sense amplifier 710 shown in FIG. 6A is the same as a first sense amplifier 710 shown in FIG. 6B, and although not illustrated in drawings, a plurality of sense amplifiers may be connected to a SAP driving node 740 and a SAN driving node 750. In the examples of FIGS. 6A and 6B, a SAP driving control signal LAPG may have a low level compared to a predetermined value during the activation thereof, and a SAN driving control signal LANG may have a high level compared to a predetermined value during the activation thereof. For example, the SAP driving control signal LAPG may be an active low signal, and the SAN driving control signal LANG may be an active high signal.

Referring to FIG. 6A, according to this exemplary embodiment, a sense amplifier driving circuit 310a that is an example of the sense amplifier 310 of FIG. 5 may include a drain driver 311a, a source driver 312a, and a source controller 313a. The drain driver 311a may include a PMOS transistor P3a having a source connected to a power node 410, a gate to which the SAP driving control signal LAPG is applied, and a drain connected to a SAP driving node 740. The source driver 312a may include an NMOS transistor N3a having a source connected to a ground node 420, a gate to which a source control signal CSS is applied, and a drain connected to the SAN driving node 750. The source controller 313a may include an NMOS transistor N4a having a drain to which a voltage VDD_SA of the SAP driving node 740 is applied, a gate to which the SAN driving control signal LANG is applied, and a source outputting the source control signal CSS.

According to an exemplary embodiment, the NMOS transistor N3a of the source driver 312a may have a size (that is, a channel width W and a length L) adjusted so that the ratio of an offset of a voltage VSS_SA of the SAN driving node 750 to an offset of the voltage VDD_SA of the SAP driving node 740 remains substantially constant according to the source control signal CSS.

Referring to FIG. 6B, according to an exemplary embodiment, a sense amplifier driving circuit 310b that is another example of the sense amplifier 310 of FIG. 5 may include a drain driver 311b, a source driver 312b, and a source controller 313b. The drain driver 311b may include a PMOS transistor P3b having a source connected to a power node 410, a gate to which the SAP driving control signal LAPG is applied, and a drain connected to a SAP driving node 740. The source driver 312b may include an NMOS transistor N3b having a source connected to a ground node 420, a gate to which a source control signal CSS is applied, and a drain connected to a SAN driving node 750. The source controller 313b may include a voltage amplifier A1 receiving a voltage VDD_SA of the SAP driving node 740 as an input, and an NMOS transistor N4b having a drain to which an output of the voltage amplifier A1 is applied, a gate to which the SAN driving control signal LANG is applied, and a source outputting the source control signal CSS.

According to an exemplary embodiment, the voltage amplifier A1 of the source controller 313b may have a gain adjusted so that the ratio of an offset of a voltage VSS_SA of the SAN driving node 750 to an offset of the voltage VDD_SA of the SAP driving node 740 remains substantially constant according to the source control signal CSS. In other words, in the example shown in FIG. 6A, the size of the NMOS transistor N3a of the source driver 312a may be adjusted so that the ratio of an offset of the voltage VSS_SA of the SAN driving node 750 to an offset of the voltage VDD_SA of the SAP driving node 740 is maintained to be substantially constant. In the example shown in FIG. 6B, the gain of the voltage amplifier A1 of the source controller 313b may be adjusted so that the ratio of an offset of the voltage VSS_SA of the SAN driving node 750 to an offset of the voltage VDD_SA of the SAP driving node 740 is maintained to be substantially constant.

Figure 7:
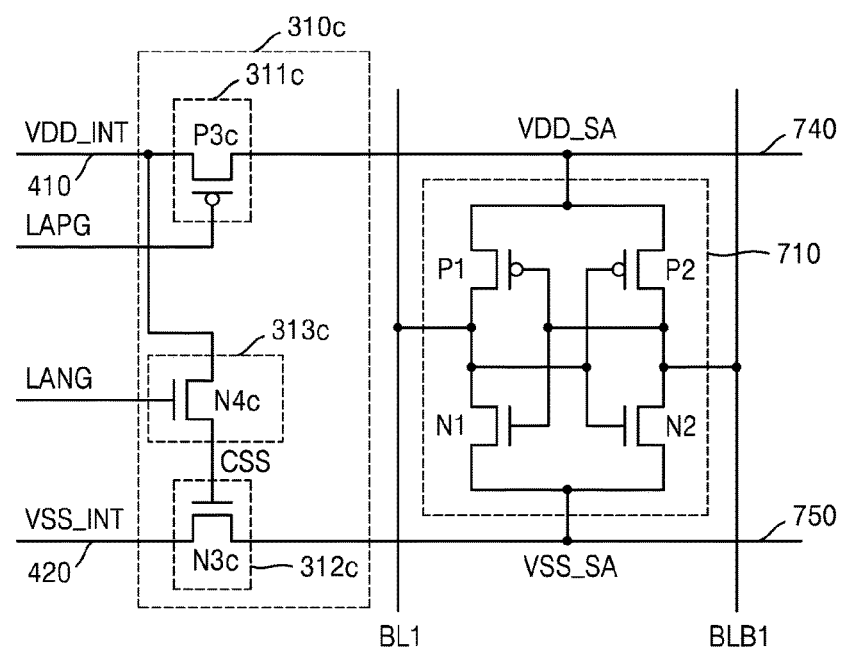
FIG. 7 is a circuit diagram of a sense amplifier driving circuit according to an exemplary embodiment.

FIG. 7 is a circuit diagram of a sense amplifier driving circuit 310c according to an exemplary embodiment. The sense amplifier driving circuit 310c of FIG. 7 is similar to the sense amplifier driving circuit 310 of FIG. 5 in that the sense amplifier driving circuit 310c of FIG. 7 adaptively adjusts a voltage VSS_SA of a SAN driving node 750. However, the sense amplifier driving circuit 310c of FIG. 7 is different from the sense amplifier driving circuit 310 using the voltage VDD_SA of the SAP driving node 740 in that the sense amplifier driving circuit 310c of FIG. 7 uses a voltage VDD_INT of a power node 410.

When the majority of memory cells connected to an activated word line store the same data, the voltage VDD_INT of the power node 410 that is electrically connected to a SAP driving node 740 via a drain driver 311c, as well as a voltage VDD_SA of the SAP driving node 740 that is shared by sense amplifiers, may vary. Accordingly, the voltage VDD_INT of the power node 410 may be used to adjust the voltage VSS_SA of the SAN driving node 750.

In some embodiments, referring to FIG. 7, the sense amplifier driving circuit 310c may include the drain driver 311c, a source driver 312c, and a source controller 313c. The drain driver 311c may include a PMOS transistor P3c having a source connected to a power node 410, a gate to which a SAP driving control signal LAPG is applied, and a drain connected to the SAP driving node 740. The source driver 312c may include an NMOS transistor N3c having a source connected to a ground node 420, a gate to which a source control signal CSS is applied, and a drain connected to the SAN driving node 750. The source controller 313c may include an NMOS transistor N4c having a drain to which the voltage VDD_INT of the power node 410 is applied, a gate to which a SAN driving control signal LANG is applied, and a source outputting the source control signal CSS.

Similar to the example shown in FIG. 6A, the NMOS transistor N3c of the source driver 312c may have a size (that is, a channel width W and a length L) adjusted so that the ratio of an offset of the voltage VSS_SA of the SAN driving node 750 to an offset of the voltage VDD_SA of the SAP driving node 740 remains substantially constant according to the source control signal CSS.

Although not illustrated in drawings, in an exemplary embodiment using the voltage VDD_INT of the power node 410, similar to the example shown in FIG. 6B, the source controller 313c may include a voltage amplifier that has a gain adjusted so that the ratio of an offset of the voltage VSS_SA of the SAN driving node 750 to an offset of the voltage VDD_SA of the SAP driving node 740 remains substantially constant according to the source control signal CSS.

Figure 8:
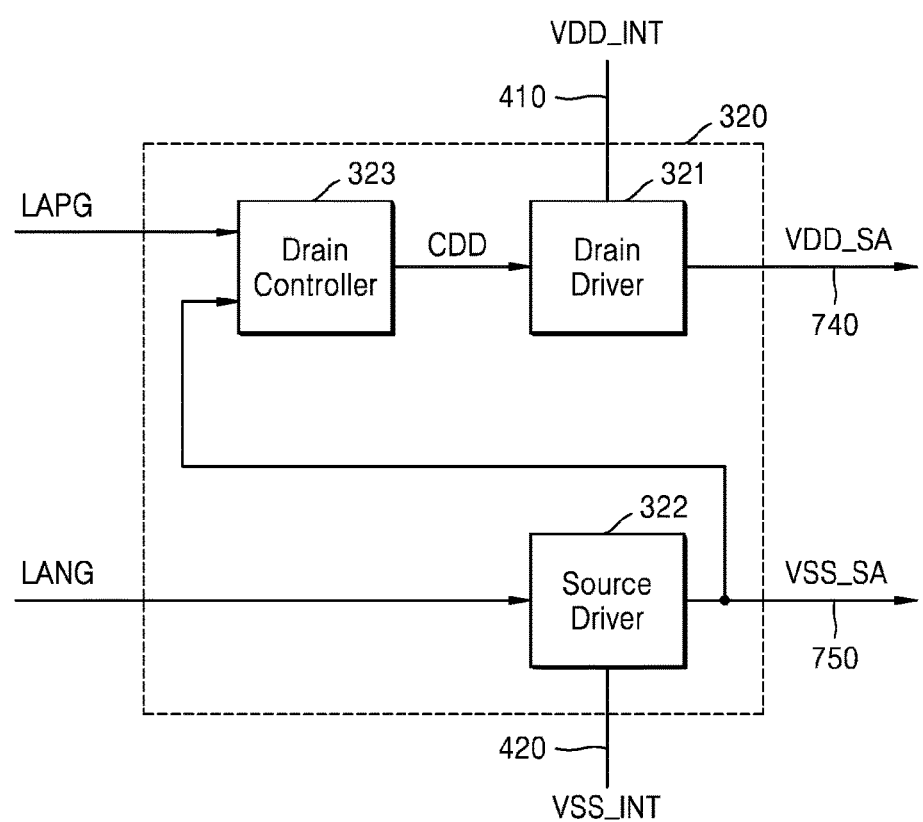
FIG. 8 is a block diagram of a sense amplifier driving circuit according to an exemplary embodiment.

FIG. 8 is a block diagram of a sense amplifier driving circuit 320 according to an exemplary embodiment. As shown in FIG. 8, the sense amplifier driving circuit 320 may include a drain driver 321, a source driver 322, and a drain controller 324.

The source driver 322 may draw current from a SAN driving node 750 to a ground node 420 based on a SAN driving control signal LANG. For example, the source driver 322 may include a switch that electrically connects the SAN driving node 750 to the ground node 420 when receiving an activated SAN driving control signal LANG.

The drain controller 323 may generate a drain control signal CDD based on a SAP driving control signal LAPG and a voltage VSS_SA of the SAN driving node 750. For example, as described below with reference to FIGS. 9A and 9B, the drain controller 323 may generate the drain control signal CDD, which has a voltage that is proportional to the voltage VSS_SA of the SAN driving node 750, when the SAP driving control signal LAPG is activated.

The drain driver 321 may supply a current from a power node 410 to a SAP driving node 740 based on the drain control signal CDD. For example, the drain driver 321 may include a switch that electrically connects the power node 410 to the SAP driving node 740, and the amount of current that is supplied from the power node 410 to the SAP driving node 740 through the switch may be adjusted according to a voltage of the drain control signal CDD. Due to the voltage VSS_SA of the SAN driving node 750 having a negative offset, the drain control signal CDD may have a relatively low voltage, and the drain driver 321 may increase a current, which is supplied from the power node 410 to the SAP driving node 740, in response to the drain control signal CDD. Accordingly, the voltage VDD_SA of the SAP driving node 740 may have a positive offset. Due to the voltage VSS_SA of the SAN driving node 750 having a positive offset, the drain control signal CDD may have a relatively high voltage, and the drain driver 321 may decrease a current, which is supplied from the power node 410 to the SAP driving node 740, in response to the drain control signal CDD. Accordingly, the voltage VDD_SA of the SAP driving node 740 may have a negative offset. That is, the amount of an offset of the voltage VDD_SA of the SAP driving node 740 may be proportional to the amount of an offset of the voltage VSS_SA of the SAN driving node 750. For example, if the amount of the offset of the voltage VDD_SA of the SAP driving node 740 is increased, the amount of the offset of the voltage VSS_SA of the SAN driving node 750 is also increased (in magnitude, but with an opposite polarity). Alternatively, if the amount of the offset of the voltage VDD_SA of the SAP driving node 740 is decreased, the amount of the offset of the voltage VSS_SA of the SAN driving node 750 is also decreased (in magnitude, but with an opposite polarity).

Similar to the sense amplifier driving circuit 310 of FIG. 5, by means of the sense amplifier driving circuit 320, the sign of the offset of the voltage VDD_SA of the SAP driving node 740 may be different from that of the offset of the voltage VSS_SA of the SAN driving node 750, and the amount of the offset of the voltage VDD_SA and the amount of the offset of the voltage VSS_SA may be adjusted so that a P/N ratio of a sense amplifier is maintained to be substantially constant.

Figure 9A:
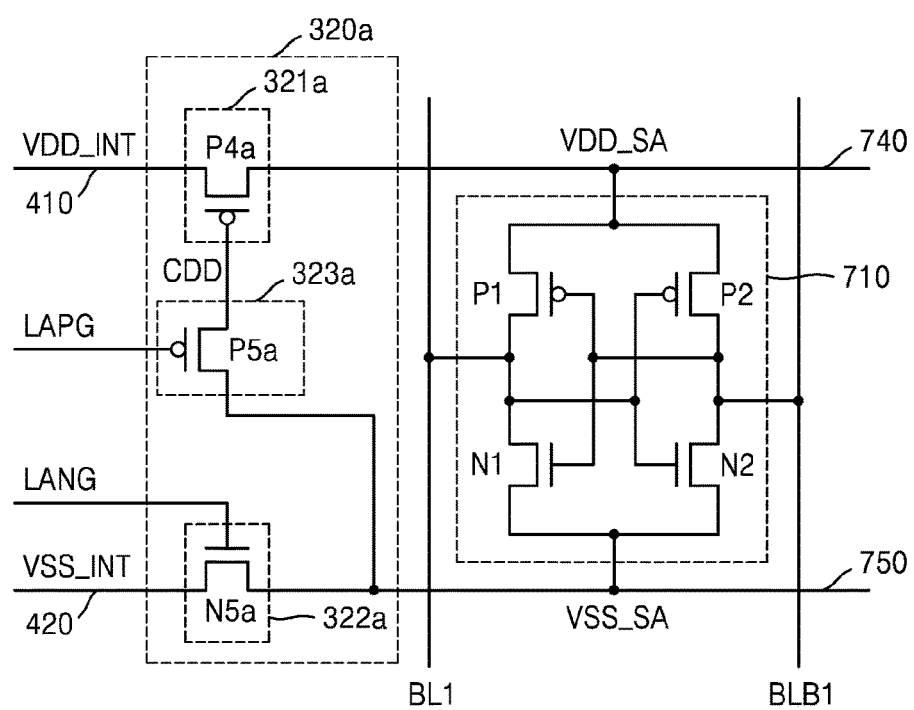
FIGS. 9A and 9B are circuit diagrams illustrating examples of the sense amplifier driving circuit of FIG. 8.
Figure 9B:
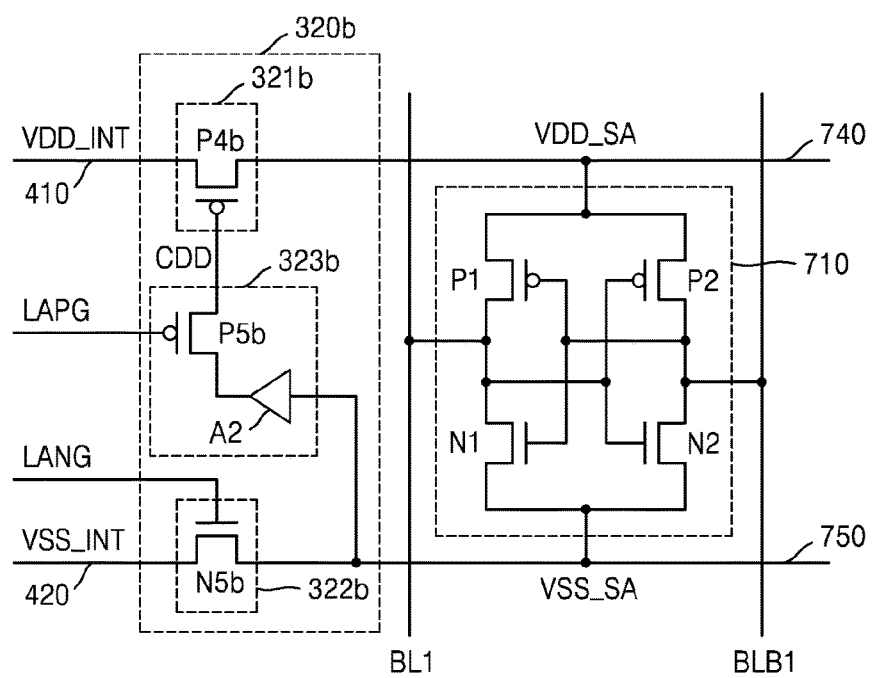

FIGS. 9A and 9B are circuit diagrams illustrating example embodiments of the sense amplifier driving circuit 320 of FIG. 8. It is assumed that a first sense amplifier 710 shown in FIG. 9A is the same as a first sense amplifier 710 shown in FIG. 9B, and although not illustrated in drawings, a plurality of sense amplifiers may be connected to a SAP driving node 740 and a SAN driving node 750. In the examples of FIGS. 9A and 9B, a SAP driving control signal LAPG may have a low level during the activation thereof, and a SAN driving control signal LANG may have a high level during the activation thereof. In other words, the SAP driving control signal LAPG is an active low signal, and the SAN driving control signal LANG may be an active high signal.

In this exemplary embodiment, referring to FIG. 9A, a sense amplifier driving circuit 320*a* that is an example of the sense amplifier 320 of FIG. 8 may include a drain driver 321*a*, a source driver 322*a*, and a drain controller 323*a*. The drain driver 321*a* may include a PMOS transistor P4*a* having a source connected to a power node 410, a gate to which a drain control signal CDD is applied, and a drain connected to a SAP driving node 740. The source driver 322*a* may include an NMOS transistor N5*a* having a source connected to a ground node 420, a gate to which the SAN driving control signal LANG is applied, and a drain connected to the SAN driving node 750. The drain controller 323*a* may include a PMOS transistor P5*a* having a drain to which a voltage VSS_SA of the SAN driving node 750 is applied, a gate to which the SAP driving control signal LAPG is applied, and a source outputting the drain control signal CDD.

According to an exemplary embodiment, the PMOS transistor P4*a* of the drain driver 322*a* may have a size (that is, a channel width W and a length L) adjusted so that the ratio of an offset of a voltage VSS_SA of the SAN driving node 750 to an offset of the voltage VDD_SA of the SAP driving node 740 remains substantially constant according to the drain control signal CDD.

In an exemplary embodiment, referring to FIG. 9B, a sense amplifier driving circuit 320*b* that is another example of the sense amplifier 320 of FIG. 8 may include a drain driver 321*b*, a source driver 322*b*, and a drain controller 323*b*. The drain driver 321*b* may include a PMOS transistor P4*b* having a source connected to a power node 410, a gate to which a drain control signal CDD is applied, and a drain connected to a SAP driving node 740. The source driver 322*b* may include an NMOS transistor N5*b* having a source connected to a ground node 420, a gate to which the SAN driving control signal LANG is applied, and a drain connected to a SAN driving node 750. The drain controller 323*b* may include a voltage amplifier A2 receiving a voltage VSS_SA of the SAN driving node 750 as an input, and a PMOS transistor P5*b* having a drain to which an output of the voltage amplifier A2 is applied, a gate to which the SAP driving control signal LAPG is applied, and a source outputting the drain control signal CDD.

According to an exemplary embodiment, the voltage amplifier A2 of the drain controller 323*b* may have a gain adjusted so that the ratio of an offset of a voltage VSS_SA of the SAN driving node 750 to an offset of the voltage VDD_SA of the SAP driving node 740 remains substantially constant according to the drain control signal CDD. For example, in the example shown in FIG. 9A, the size of the PMOS transistor P4*a* of the drain driver 321*a* may be adjusted so that the ratio of an offset of the voltage VSS_SA of the SAN driving node 750 to an offset of the voltage VDD_SA of the SAP driving node 740 is maintained to be substantially constant. In the example shown in FIG. 9B, the gain of the voltage amplifier A2 of the drain controller 323*b* may be adjusted so that the ratio of an offset of the voltage VSS_SA of the SAN driving node 750 to an offset of the voltage VDD_SA of the SAP driving node 740 is maintained to be substantially constant.

Figure 10:
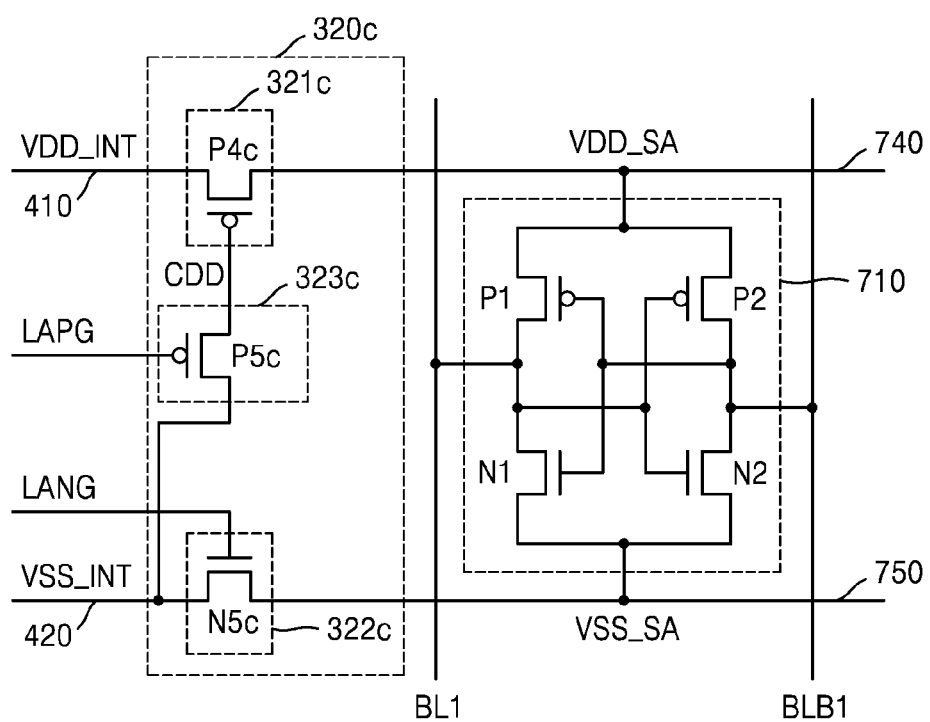
FIG. 10 is a circuit diagram of a sense amplifier driving circuit according to an exemplary embodiment.

FIG. 10 is a circuit diagram of a sense amplifier driving circuit 320*c* according to an exemplary embodiment. The sense amplifier driving circuit 320*c* of FIG. 10 is similar to the sense amplifier driving circuit 320 of FIG. 8 in that the sense amplifier driving circuit 320*c* of FIG. 10 adaptively adjusts a voltage VDD_SA of a SAP driving node 740. However, the sense amplifier driving circuit 320*c* of FIG. 10 is different from the sense amplifier driving circuit 320 using the voltage VSS_SA of the SAN driving node 750 in that the sense amplifier driving circuit 320*c* of FIG. 10 uses a voltage VSS_INT of a ground node 420.

According to this exemplary embodiment, when the majority of memory cells connected to an activated word line store the same data, the voltage VSS_INT of the ground node 420 that is electrically connected to a SAN driving node 750 via a source driver 322c, as well as a voltage VSS_SA of the SAN driving node 750 that is shared by sense amplifiers, may vary. Accordingly, the voltage VSS_INT of the ground node 420 may be used to adjust the voltage VDD_SA of the SAP driving node 740.

Referring to FIG. 10, the sense amplifier driving circuit 320c may include a drain driver 321c, the source driver 322c, and a drain controller 323c. The drain driver 321c may include a PMOS transistor P4c having a source connected to a power node 410, a gate to which a drain control signal CDD is applied, and a drain connected to the SAP driving node 740. The source driver 322c may include an NMOS transistor N5c having a source connected to a ground node 420, a gate to which a SAN driving control signal LANG is applied, and a drain connected to the SAN driving node 750. The drain controller 323c may include a PMOS transistor P5c having a drain to which the voltage VSS_INT of the ground node 420 is applied, a gate to which a SAP driving control signal LAPG is applied, and a source outputting the drain control signal CDD.

Similar to the example shown in FIG. 9A, the PMOS transistor P4c of the drain driver 321c may have a size (that is, a channel width W and a length L) adjusted so that the ratio of an offset of the voltage VSS_SA of the SAN driving node 750 to an offset of the voltage VDD_SA of the SAP driving node 740 remains substantially constant according to the drain control signal CDD.

Although not illustrated in drawings, in an exemplary embodiment using the voltage VSS_INT of the ground node 420, similar to the example shown in FIG. 9B, the drain controller 323c may include a voltage amplifier that has a gain adjusted so that the ratio of an offset of the voltage VSS_SA of the SAN driving node 750 to an offset of the voltage VDD_SA of the SAP driving node 740 remains substantially constant according to the drain control signal CDD.

Figure 11A:
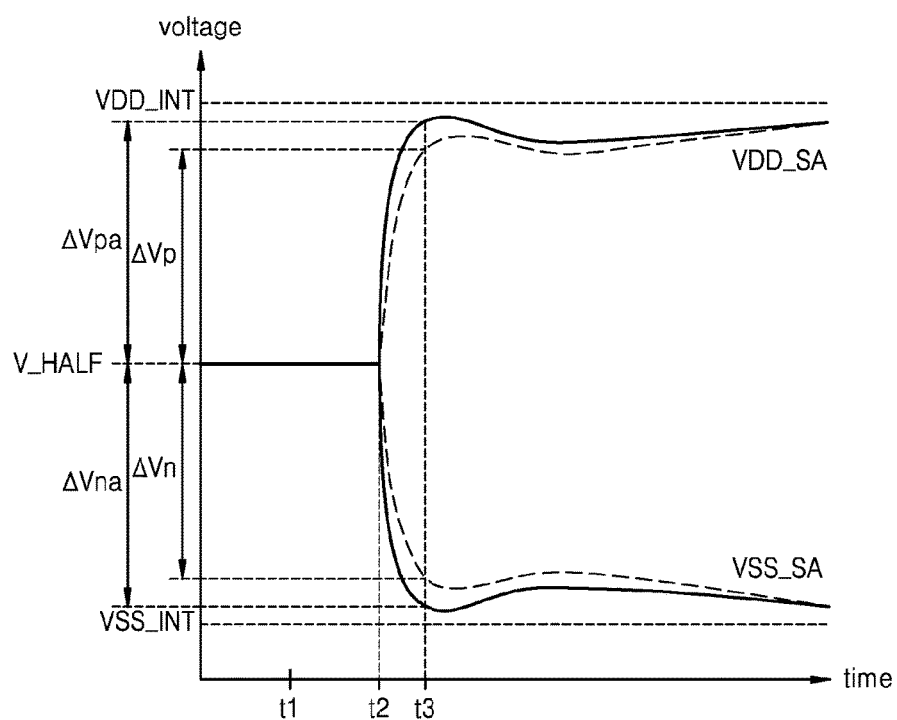
FIGS. 11A and 11B are graphs illustrating voltage changes of drain and source nodes, according to an exemplary embodiment.
Figure 11B:
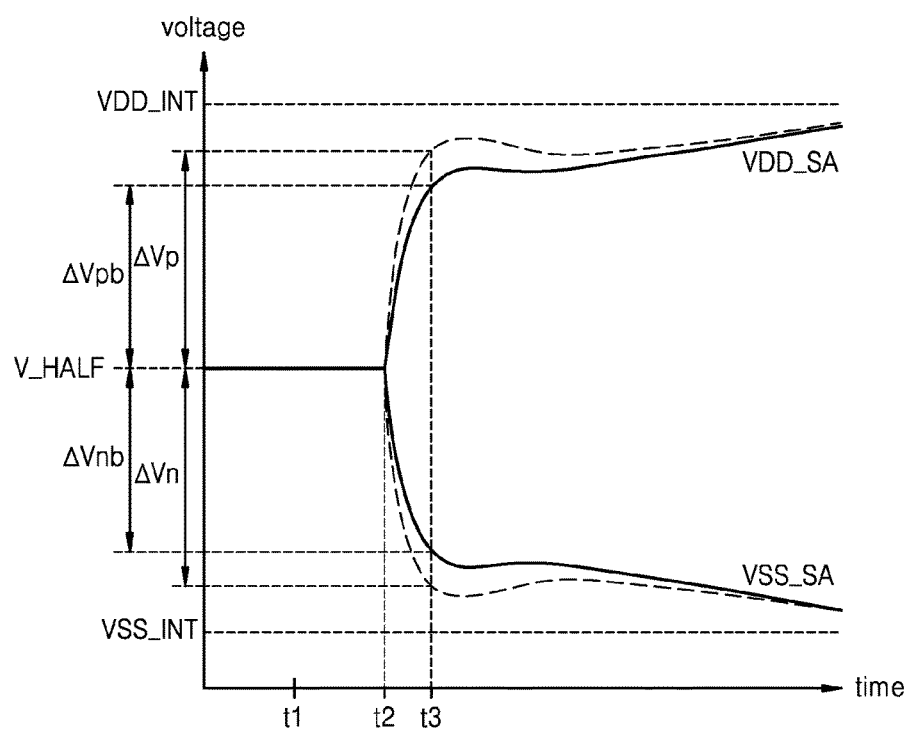

FIGS. 11A and 11B are graphs illustrating voltage changes of the drain and source nodes 740 and 750, according to an exemplary embodiment. In detail, FIGS. 11A and 11B are graphs illustrating voltage changes of the drain and source nodes 740 and 750 when sense amplifiers are driven by a sense amplifier driving circuit (for example, the sense amplifier driving circuit 310 shown in FIG. 5 or the sense amplifier driving circuit 320 shown in FIG. 8) according to an exemplary embodiment.

FIG. 11A is a graph illustrating voltage changes of the drain and source nodes 740 and 750, respectively, when data stored in the majority of memory cells connected to an activated word line is '1', and FIG. 11B is a graph illustrating voltage changes of the SAP driving node 740 and the source node 750 when data stored in the majority of memory cells connected to an activated word line is '0'. In FIGS. 11A and 11B, a curve indicated by a dashed line illustrates changes of the drain and source nodes 740 and 750, respectively, when data stored in the majority of memory cells connected to an activated word line is not '1' or '0', that is, when the memory cells relatively evenly stores '1' or '0'. Hereinafter, FIGS. 11A and 11B will be described with reference to FIGS. 5 and 8.

In an exemplary embodiment, referring to FIG. 11A, when data stored in the majority of memory cells connected to an activated word line is '1', the voltage VDD_SA of the SAP driving node 740 may have a positive offset based on the curve indicated by a dashed line, and the voltage VSS_SA of the SAN driving node 750 may have a negative offset based on the curve indicated by a dashed line. At t3, the ratio $\Delta Vpa/\Delta Vna$ of a variation $\Delta Vpa$ in the voltage VDD_SA of the SAP driving node 740 to a variation $\Delta Vna$ in the voltage VSS_SA of the SAN driving node 750 may be substantially the same as $\Delta Vp/\Delta Vn$. In other words, a P/N ratio may be substantially constant, and thus, a malfunction of a sense amplifier may be prevented.

In the exemplary embodiment of FIG. 11B, when data stored in the majority of memory cells connected to an activated word line is '0', the voltage VDD_SA of the SAP driving node 740 may have a negative offset based on the curve indicated by a dashed line, and the voltage VSS_SA of the SAN driving node 750 may have a positive offset based on the curve indicated by a dashed line. At t3, the ratio $\Delta Vpb/\Delta Vnb$ of a variation $\Delta Vpb$ in the voltage VDD_SA of the SAP driving node 740 to a variation $\Delta Vnb$ in the voltage VSS_SA of the SAN driving node 750 may be substantially the same as $\Delta Vp/\Delta Vn$. In other words, a P/N ratio may be substantially constant, and thus, a malfunction of a sense amplifier may be prevented.

As shown in the graphs of FIGS. 11A and 11B, the voltage VDD_SA of the SAP driving node 740 of a sense amplifier and the voltage VSS_SA of the SAN driving node 750 of the sense amplifier may be adaptively changed, according to data that is sensed by the sense amplifier, so that a P/N ratio of the sense amplifier is maintained to be substantially constant.

Figure 12:
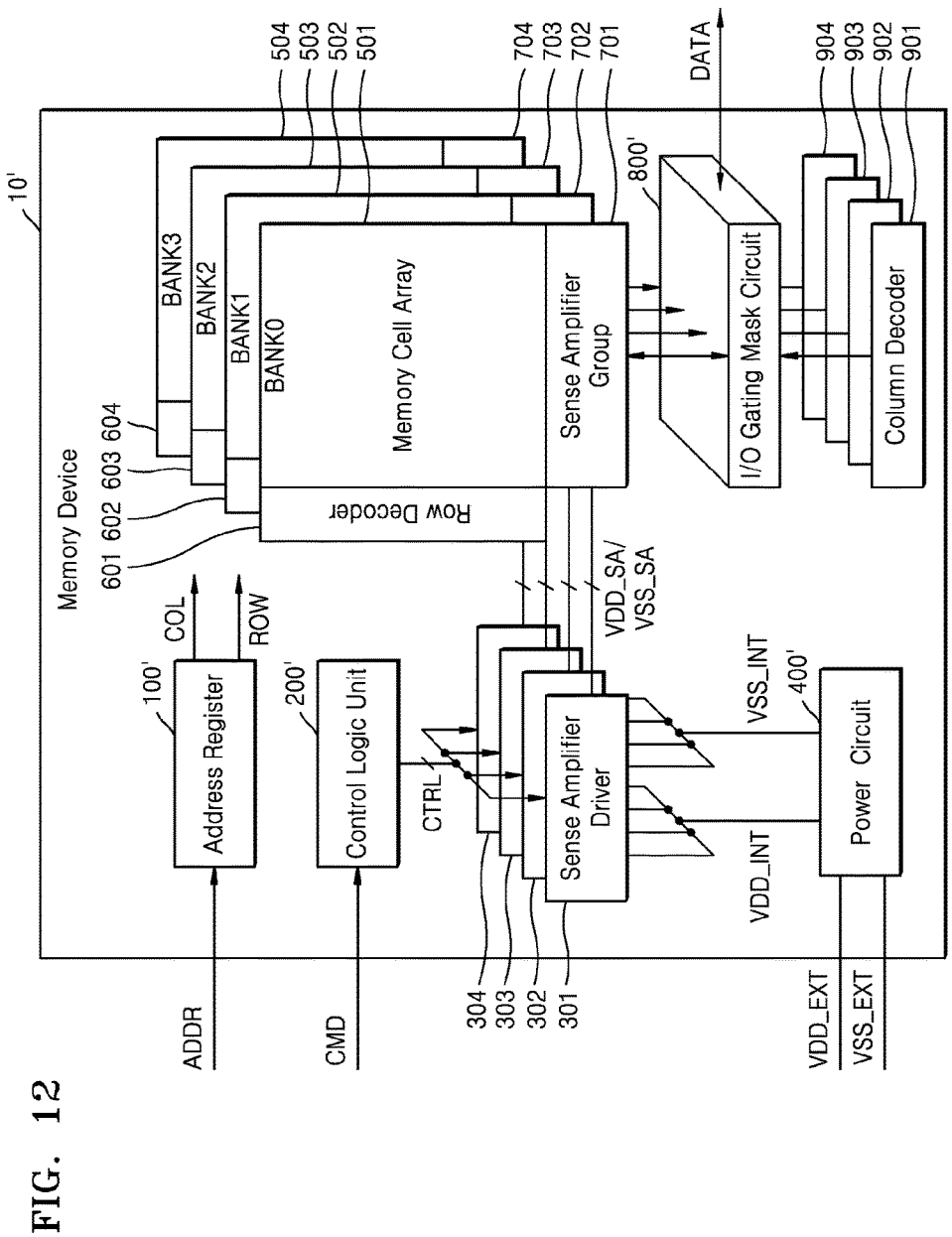
FIG. 12 is a block diagram of a memory device according to an exemplary embodiment.

FIG. 12 is a block diagram of a memory device 10' according to an exemplary embodiment. When comparing the memory device 10' with the memory device 10 of FIG. 1, the memory device 10' may include a memory cell array including a plurality of banks 501 to 504 that may be accessed simultaneously (read, write, refresh, e.g.). Each of the banks may be accessed while another of the banks is accessed. Referring to FIG. 12, the memory device 10' may include an address register 100', a control logic unit 200', a plurality of sense amplifier driving circuits 301 to 304, a power circuit 400', the plurality of banks 501 to 504 (e.g., a plurality of bank arrays), a plurality of row decoders 601 to 604, a plurality of sense amplifier groups 701 to 704, an input/output gating mask circuit 800', and a plurality of column decoders 901 to 904. In some embodiments, the plurality of row decoders 601 to 604 respectively coupled to the plurality of banks 501 to 504, the plurality of column decoders 901 to 904 respectively coupled to the plurality of banks 501 to 504, and the plurality of sense amplifiers 701 to 704 respectively coupled to the plurality of banks. In some embodiments, each of the plurality of banks 501 to 504 may include a plurality of memory cells MC, and each of memory cells MC is coupled to a corresponding word-line and a corresponding bit-line. Although the memory device 10' of the exemplary embodiment of FIG. 12 includes four banks 501 to 504, the inventive concept is not limited. The memory device 10' may include more than four or less than four banks. Hereinafter, descriptions that overlap with the descriptions of FIG. 1 will be omitted.

According to the current exemplary embodiment, the memory cell array of the memory device 10' may include the plurality of banks 501 to 504. The memory device 10' may include the plurality of senses amplifier groups 701 to 704 that correspond to the plurality of banks 501 to 504, respectively, and the plurality of sense amplifier groups 701 to 704 may be driven by the plurality of sense amplifier driving circuits 301 to 304, respectively.

As described above, the plurality of sense amplifier driving circuits 301 to 304 may provide sense amplifier driving voltages VDD_SA and VSS_SA to the plurality of sense amplifier groups 701 to 704, respectively. The plurality of sense amplifier driving circuits 301 to 304 may provide the sense amplifier driving voltages VDD_SA and VSS_SA that adaptively vary according to data which is sensed by each of the plurality of sense amplifier groups 701 to 704, and thus may prevent a malfunction of each of the plurality of sense amplifier groups 701 to 704, that is, an operation of sensing a signal corresponding to data that is different from that stored in a memory cell.

Figure 13:
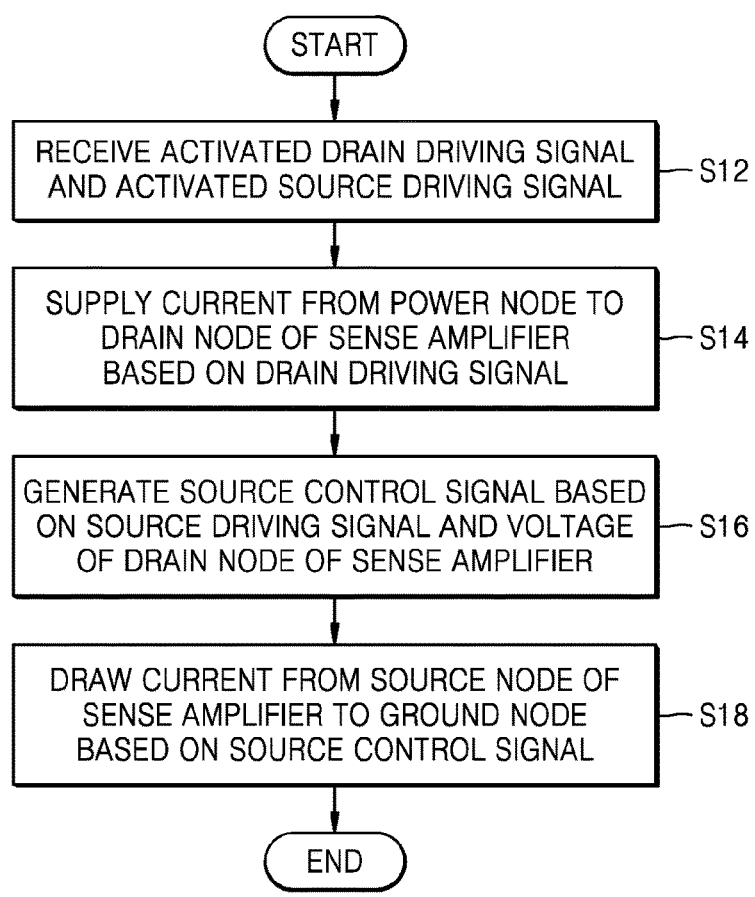
FIG. 13 is a flowchart illustrating an operating method of a sense amplifier driving circuit, according to an exemplary embodiment.
Figure 14:
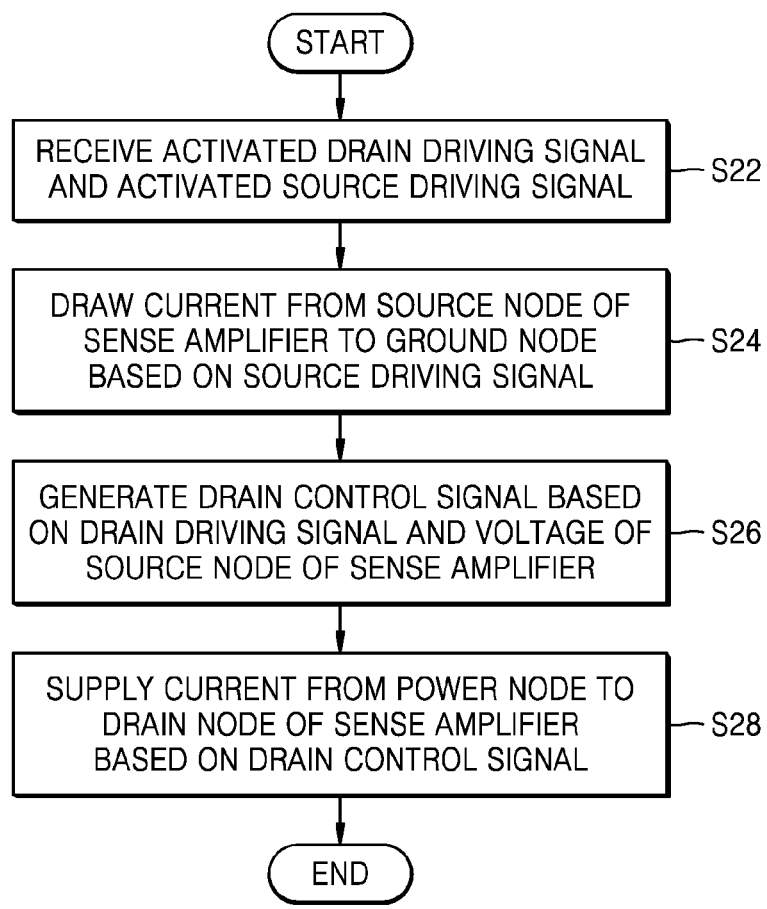
FIG. 14 is a flowchart illustrating an operating method of a sense amplifier driving circuit, according to another exemplary embodiment.

FIG. 13 is a flowchart illustrating an operating method of a sense amplifier driving circuit, according to an exemplary embodiment, and FIG. 14 is a flowchart illustrating an operating method of a sense amplifier driving circuit, according to another exemplary embodiment. In detail, FIG. 13 is a flowchart illustrating an operating method of the sense amplifier driving circuit 310 of FIG. 5, and FIG. 14 is a flowchart illustrating an operating method of the sense amplifier driving circuit 320 of FIG. 8. Hereinafter, FIGS. 13 and 14 will be described with reference to FIGS. 5 and 8.

Referring to FIG. 13, in operation S12, an operation of receiving an activated SAP driving control signal and an activated SAN driving control signal may be performed. For example, in FIG. 5, the drain driver 311 and the source controller 313 of the sense amplifier driving circuit 310 may receive an activated SAP driving control signal LAPG and an activated SAN driving control signal LANG, respectively.

In operation S14, an operation of supplying a current from a power node to a SAP driving node of a sense amplifier based on the SAP driving control signal may be performed. For example, in FIG. 5, the drain driver 311 may supply a current from the power node 410 to the SAP driving node 740 of a sense amplifier based on the SAP driving control signal LAPG.

In operation S16, an operation of generating a source control signal based on the SAN driving control signal and a voltage of the SAP driving node of the sense amplifier may be performed. For example, in FIG. 5, the source controller 313 may generate the source control signal CSS, which has a voltage that is proportional to the voltage VDD_SA of the SAP driving node 740, when the SAN driving control signal LANG is activated.

In operation S18, an operation of drawing current from a SAN driving node of the sense amplifier to a ground node based on the source control signal may be performed. For example, in FIG. 5, the source driver 312 may draw current from the SAN driving node 750 to the ground node 420 based on the source control signal CSS, and thus, the voltage VSS_SA of the SAN driving node 750 may be adjusted.

Referring to FIG. 14, in operation S22, an operation of receiving an activated SAP driving control signal and an activated SAN driving control signal may be performed. For example, in FIG. 8, the source driver 322 and the drain controller 323 of the sense amplifier driving circuit 320 may receive an activated SAN driving control signal LANG and an activated SAP driving control signal LAPG, respectively.

In operation S24, an operation of drawing current from a SAN driving node of a sense amplifier to a ground node based on the SAN driving control signal may be performed. For example, in FIG. 8, the source driver 322 may draw current from the SAN driving node 750 to the ground node 420 based on the SAN driving control signal LANG.

In operation S26, an operation of generating a drain control signal based on the SAP driving control signal and a voltage of the SAN driving node of the sense amplifier may be performed. For example, in FIG. 8, the drain controller 323 may generate the drain control signal CDD, which has a voltage that is proportional to the voltage VSS_SA of the SAN driving node 750, when the SAP driving control signal LAPG is activated.

In operation S28, an operation of supplying a current from a power node to a SAP driving node of the sense amplifier based on the drain control signal may be performed. For example, in FIG. 8, the drain driver 321 may supply a current from the power node 410 to the SAP driving node 740 based on the drain control signal CDD, and thus, the voltage VDD_SA of the SAP driving node 740 may be adjusted.

Figure 15:
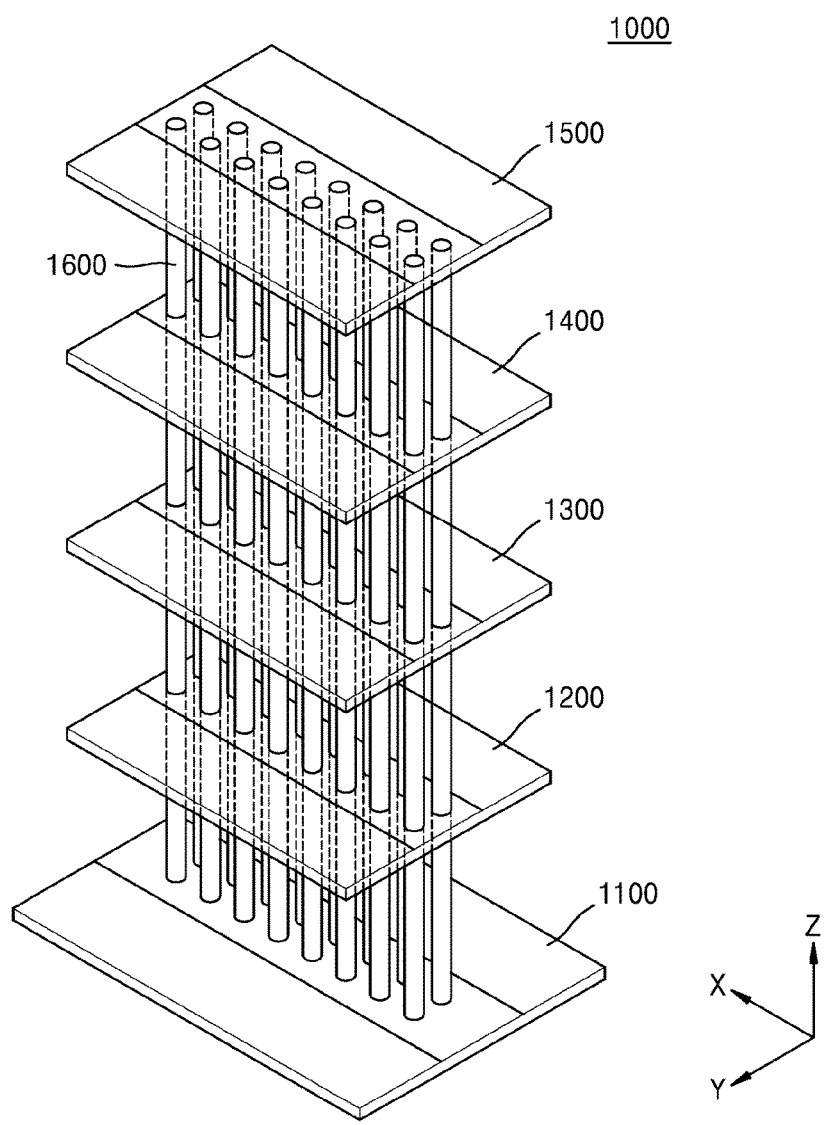
FIG. 15 is a diagram illustrating an example of a memory device according to an exemplary embodiment.

FIG. 15 is a diagram illustrating an example of a memory device according to an exemplary embodiment. According to the current exemplary embodiment, the memory device 1000 may include a plurality of stacked semiconductor chips 1100 to 1500. For example, as shown in FIG. 15, the memory device 1000 may be a semiconductor memory device, and may include an interface chip 1100 and a plurality of memory chips 1200 to 1500. The interface chip 1100 and the plurality of memory chips 1200 to 1500 may be connected by a through silicon via (TSV) 1600.

Each of the plurality of memory chips 1200 to 1500 may include a memory cell array and a sense amplifier group connected to the memory cell array through bit lines. In addition, each of the plurality of memory chips 1200 to 1500 may include a sense amplifier driving circuit according to any one of the exemplary embodiments described above.

Figure 16:
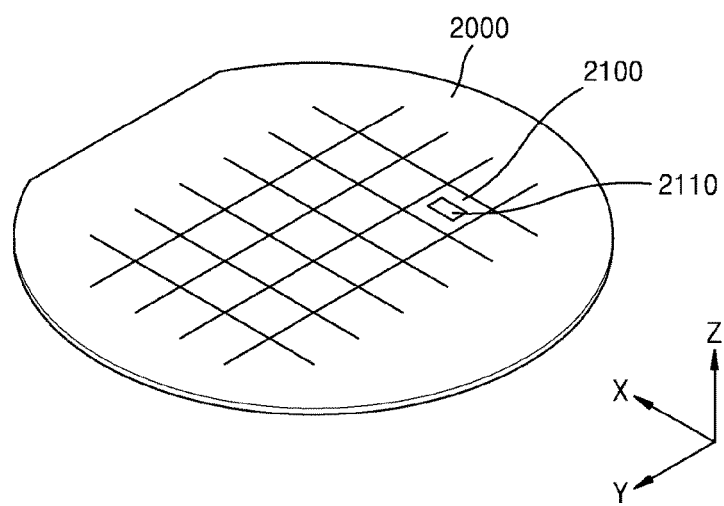
FIG. 16 is a diagram illustrating a semiconductor wafer including a memory device according to an exemplary embodiment.

FIG. 16 is a diagram illustrating a semiconductor wafer 2000 including a memory device according to an exemplary embodiment.

Referring to FIG. 16, the memory device according to the current exemplary embodiment may be processed in the semiconductor wafer 2000, and may be a semiconductor chip 2100 that is separated from the semiconductor wafer 2000. The semiconductor chip 2100 may include a sense amplifier driving circuit 2110 according to any one of the exemplary embodiments described above, and the sense amplifier driving circuit 2110 may provide sense amplifier driving voltages to sense amplifiers so that a P/N ratio of each of the sense amplifiers is maintained to be substantially constant.

Figure 17:
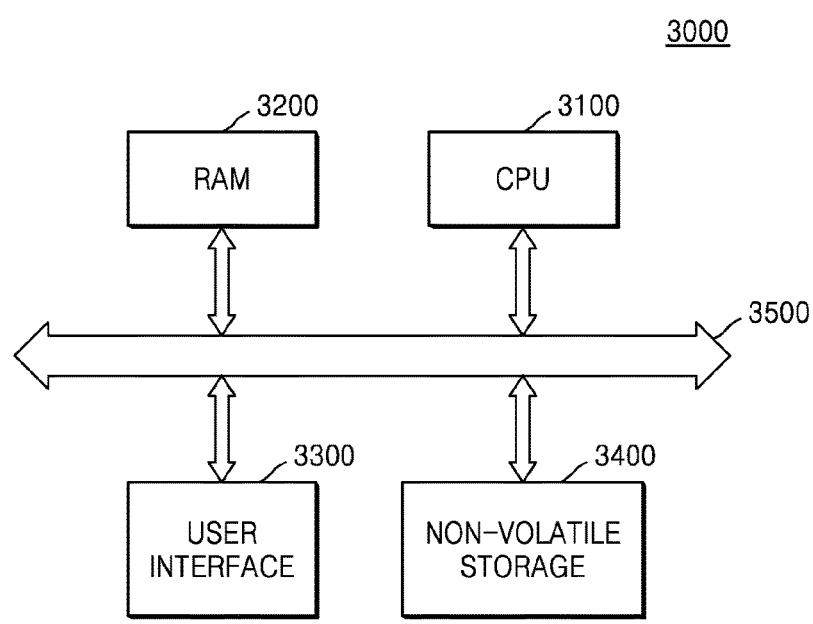
FIG. 17 is a block diagram of a computing system according to an exemplary embodiment.

FIG. 17 is a block diagram of a computing system 3000 according to an exemplary embodiment. As shown in FIG. 17, the computing system 3000 may include a central processing unit (CPU) 3100, a RAM 3200, a user interface 3300, and a non-volatile storage device 3400. The CPU 3100, the RAM 3200, the user interface 3300, and the non-volatile storage device 3400 may communicate with one another via a bus 3500. Although not illustrated in FIG. 17, the computing system 3000 may further include ports that may communicate with a video card, a sound card, a memory card, and/or a universal serial bus (USB) device or may communicate with other electronic devices. The computing system 3000 may be implemented as a personal computer or may be implemented as a mobile electronic device, such as a note computer, a mobile phone, a personal digital assistant (PDA), or a camera.

The CPU 3100 may perform specific calculations or tacks. According to an exemplary embodiment, the CPU 3100 may be a micro-processor or a graphics processing unit (GPU). The CPU 3100 may communicate with the RAM 3200, the non-volatile storage device 3400, and the user interface 3300 via the bus 3500. The CPU 3100 may also be connected to an expansion bus such as a peripheral component interconnect (PCI) bus.

The RAM 3200 may store data that is necessary for an operation of the computing system 3000. For example, the RAM 3200 may function as a data memory of the CPU 3100, and may support a direct memory access (DMA) and thus store data received from the bus 3500 or transmit stored data to the bus 3500. A memory device according to any one of the exemplary embodiments described above may be included in the computing system 3000 as the RAM 3200. The RAM 3200 may include a sense amplifier driving circuit according to any one of the exemplary embodiments described above, and the sense amplifier driving circuit may provide sense amplifier driving voltages to sense amplifiers so that a P/N ratio of each of the sense amplifiers is maintained to be substantially constant. Accordingly, when a read command is received from the CPU 3100, the RAM 3200 may accurately output data stored in a memory cell.

The user interface 3300 may include an input unit, such as a keyboard, a keypad, or a mouse, to receive an input signal from a user, and may include an output unit, such as a printer or a display apparatus, to provide an output signal to a user.

The non-volatile storage device 3400 may include a non-volatile semiconductor memory device, such as EEPROM, a flash memory, PRAM, RRAM, NFGM, PoRAM, MRAM, or FRAM, and may also include a magnetic disc.

While the inventive concept has been particularly shown and described with reference to exemplary embodiments thereof, it will be understood that various changes in form and details may be made therein without departing from the spirit and scope of the following claims.

What is claimed is:

1. A semiconductor memory device, comprising:
a sense amplifier; and
a sense amplifier driving circuit configured to drive the sense amplifier in response to first and second driving control signals, wherein the sense amplifier driving circuit comprises:
a first driving circuit configured to supply current from a power node to a first driving node of the sense amplifier in response to the first driving control signal;
a second driving circuit configured to draw current from a second driving node of the sense amplifier and output the drawn current to a ground node in response to the second driving control signal; and
a control circuit configured to generate a control signal to control at least one of an operation of the first driving circuit in response to a voltage on the second driving node and an operation of the second driving circuit in response to a voltage on the first driving node.

2. The semiconductor memory device of claim 1, wherein
the first driving circuit is configured to supply current from the power node to the first driving node of the sense amplifier based on the first driving control signal;
the control circuit is configured to generate the control signal based on a second driving control signal and a voltage of the first driving node; and
the second driving circuit is configured to draw current from the second driving node of the sense amplifier and output the drawn current to the ground node based on the control signal.

3. The semiconductor memory device of claim 2, wherein the control circuit is configured to generate the control signal in a manner such that an offset voltage of the first driving node and an offset voltage of the second driving node have opposite polarities when the second driving control signal is activated,
wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1's and '0's.

4. The semiconductor memory device of claim 3, wherein a ratio of the offset voltage of the second driving node to the offset voltage of the first driving node remains substantially constant.

5. The semiconductor memory device of claim 2, wherein the second driving circuit comprises an N-type metal oxide semiconductor (MOS) transistor having a source connected to the ground node, a gate to which the control signal is applied, and a drain connected to the second driving node.

6. The semiconductor memory device of claim 5, wherein the control circuit comprises an N-type MOS transistor having a drain to which the voltage of the first driving node is applied, a gate to which the second driving control signal is applied, and a source outputting the control signal.

7. The semiconductor memory device of claim 6, wherein a ratio of the offset voltage of the second driving node to the offset voltage of the first driving node in response to the control signal remains substantially constant based on a size of the N-type MOS transistor of the second driving circuit.

8. The semiconductor memory device of claim 2, wherein the control circuit comprises:
a voltage amplifier configured to amplify the voltage of the first driving node; and
an N-type MOS transistor having a drain to which an output of the voltage amplifier is applied, a gate to which the second driving control signal is applied, and a source outputting the control signal.

9. The semiconductor memory device of claim 8, wherein a ratio of the offset voltage of the second driving node to the offset voltage of the first driving node in response to the control signal remains substantially constant based on a gain of the voltage amplifier.

10. The semiconductor memory device of claim 1, wherein the first driving circuit is connected to first driving nodes of a plurality of sense amplifiers, the second driving circuit is connected to second driving nodes of the plurality of sense amplifiers, and the number of the plurality of sense amplifiers corresponds to the number of bit line pairs arranged in a bank of the semiconductor memory device.

11. A circuit for driving a sense amplifier of a semiconductor memory device, the circuit comprising:
a first control circuit configured to generate a control signal based on a first driving control signal and a voltage of a first driving node of the sense amplifier;
a first driving circuit configured to supply current from a power node to a second driving node of the sense amplifier based on the control signal; and
a second driving circuit configured to draw current from the first driving node to a ground node based on a second driving control signal,
wherein the first control circuit generates the control signal so that a deviation of the voltage of the first driving node from a first voltage and a deviation of a voltage of the second driving node from the first voltage is substantially the same upon driving the sense amplifier.

12. The semiconductor memory device of claim 11,
wherein the control circuit is configured to generate the control signal in a manner such that an offset voltage of the first driving node and an offset voltage of the second driving node have opposite polarities when the first driving control signal is activated,
wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1's and '0's.

13. The semiconductor memory device of claim 12, wherein a ratio of the offset voltage of the first driving node to the offset voltage of the second driving node remains substantially constant.

14. The semiconductor memory device of claim 11, wherein the first driving circuit comprises a P-type metal oxide semiconductor (MOS) transistor having a source connected to the power node, a gate to which the control signal is applied, and a drain connected to the first driving node.

15. The semiconductor memory device of claim 14, wherein the control circuit comprises a P-type MOS transistor having a drain to which the voltage of the second driving node is applied, a gate to which the first driving control signal is applied, and a source outputting the control signal.

16. The semiconductor memory device of claim 15, wherein a ratio of the offset voltage of the first driving node to the offset voltage of the second driving node in response to the control signal remains substantially constant based on a size of the P-type MOS transistor of the first driving circuit.

17. The semiconductor memory device of claim 11, wherein the control circuit comprises:
a voltage amplifier configured to amplify the voltage of the second driving node; and
a P-type MOS transistor having a drain to which an output of the voltage amplifier is applied, a gate to which the first driving control signal is applied, and a source outputting the control signal.

18. The semiconductor memory device of claim 17, wherein a ratio of the offset voltage of the first driving node to the offset voltage of the second driving node in response to the control signal remains substantially constant based on a gain of the voltage amplifier.

19. A semiconductor memory device, comprising:
a sense amplifier; and
a sense amplifier driving circuit configured to drive the sense amplifier based on a driving signal, wherein the sense amplifier driving circuit comprises:
a control circuit configured to generate a control signal based on a first driving control signal and a voltage of a second driving node of the sense amplifier;
a first driving circuit configured to supply current from a power node to a first driving node of the sense amplifier based on the control signal; and
a second driving circuit configured to draw current from the second driving node to a ground node based on a second driving control signal.

20. The semiconductor memory device of claim 19,
wherein the control circuit is configured to generate the control signal in a manner such that an offset voltage of the first driving node and an offset voltage of the second driving node have opposite polarities when the first driving control signal is activated,
wherein the offset voltage of the first driving node and the offset voltage of the second driving node are determined as respective deviations of voltages of the first driving node and second driving node with respect to a sensing operation of the sense amplifier of a memory cell connected to a word line having a substantially equal number of data bits of '1's and '0's.

* * * * *